(12) United States Patent
Gavryliuk et al.

(10) Patent No.: US 10,971,789 B2
(45) Date of Patent: Apr. 6, 2021

(54) TRANSMISSION-LINE FILTERING WITH ENHANCED FREQUENCY RESPONSE

(71) Applicant: Qualcomm Incorporated, San Diego, CA (US)

(72) Inventors: Oleksandr Gavryliuk, San Diego, CA (US); Petro Komakha, Santee, CA (US); Wai San Wong, San Diego, CA (US); Volodymyr Novgorodov, San Diego, CA (US); Georgiy Sevskiy, Munich (DE); Alexander Chernyakov, Munich (DE)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/118,189

(22) Filed: Aug. 30, 2018

(65) Prior Publication Data

US 2020/0076032 A1    Mar. 5, 2020

(51) Int. Cl.
*H01P 1/203*    (2006.01)
*H03H 7/01*    (2006.01)
*H03H 7/46*    (2006.01)

(52) U.S. Cl.
CPC .......... *H01P 1/20327* (2013.01); *H01P 1/203* (2013.01); *H03H 7/0169* (2013.01); *H03H 7/468* (2013.01); *H03H 7/0123* (2013.01); *H03H 2007/0192* (2013.01)

(58) Field of Classification Search
CPC .. H03H 7/0115; H03H 7/0123; H03H 7/0169; H03H 7/468; H01P 1/20327; H01P 1/20336

USPC ................ 333/167, 174, 175, 202, 204, 205
See application file for complete search history.

(56) References Cited

U.S. PATENT DOCUMENTS

| | | | | |
|---|---|---|---|---|
| 5,124,939 A * | 6/1992 | Mori | .................. | G06J 1/005 333/166 |
| 6,023,611 A * | 2/2000 | Bolin | .................. | H03F 3/1935 330/149 |
| 2006/0152304 A1* | 7/2006 | Liang | .................. | H01P 1/2039 333/176 |
| 2007/0120627 A1* | 5/2007 | Kundu | ............... | H01P 1/20345 333/203 |
| 2010/0039189 A1 | 2/2010 | Taniguchi | | |
| 2012/0013422 A1* | 1/2012 | Tenno | ................. | H01Q 9/0407 333/24 R |

(Continued)

FOREIGN PATENT DOCUMENTS

KR    20090067292 A    6/2009
WO    2015059963 A1    4/2015

*Primary Examiner* — Rakesh B Patel
(74) *Attorney, Agent, or Firm* — QUALCOMM Incorporated

(57) ABSTRACT

Transmission-line filtering with enhanced frequency response is disclosed. In an example aspect, an apparatus includes a transmission-line filter to enhance a frequency response of a filtering operation. The transmission-line filter includes an input port, an output port, and multiple transmission-line base units. The multiple transmission-line base units are disposed between the input port and the output port and are coupled to the input port and the output port. Each of the multiple transmission-line base units includes a respective transmission line of multiple transmission lines. At least one transmission-line base unit of the multiple transmission-line base units includes a multi-resonant circuit.

23 Claims, 15 Drawing Sheets

(56) References Cited

U.S. PATENT DOCUMENTS

2015/0155844 A1 6/2015 Mizoguchi et al.
2017/0272047 A1 9/2017 Tanaka et al.

* cited by examiner

TRANSMISSION-LINE FILTERING WITH ENHANCED FREQUENCY RESPONSE

TECHNICAL FIELD

This disclosure relates generally to electronic communications and, more specifically, to enabling targeted frequency ranges to be filtered as part of a signal processing operation.

BACKGROUND

Electronic devices include traditional computing devices such as desktop computers, notebook computers, tablet computers, smartphones, wearable devices like a smartwatch, internet servers, and so forth. However, electronic devices also include other types of devices with computing power such as personal voice assistants, thermostats, automotive electronics, robotics, devices embedded in other machines like household appliances and industrial tools, Internet-of-Things (IoT) devices, and the like. These various electronic devices provide information, entertainment, social interaction, security, safety, productivity, transportation, manufacturing, and other services to human users. Thus, electronic devices play crucial roles in many aspects of modern society.

Many of the services provided by electronic devices in today's interconnected world depend at least partly on electronic communications. Electronic communications include, for example, those exchanged between or among different electronic devices using wireless or wired signals that are transmitted over one or more networks, such as the Internet or a cellular network. Electronic communications therefore include both wireless and wired transmissions and receptions. To make electronic communications, an electronic device uses a transceiver, such as a wireless transceiver.

Typically, electronic devices use a wireless transceiver to communicate with wireless signals in accordance with some wireless standard. Examples of wireless standards include an IEEE 802.11 Wi-Fi standard and a Fourth Generation (4G) cellular standard, both of which we use today with smartphones and other connected devices. However, efforts to enable a Fifth Generation (5G) wireless standard are ongoing. Next-generation 5G wireless networks are expected to offer significantly higher bandwidths, lower latencies, and access to additional electromagnetic spectrum. Taken together, this means that exciting new wireless technologies can be provided to users, such as driverless vehicles, augmented reality, on-the-go 4K video streaming, ubiquitous sensors to keep people safe and to use natural resources more efficiently, and so forth.

To enable these technologies, wireless devices will be communicating with signals that use wider frequency ranges and that span bands located at higher frequencies of the electromagnetic spectrum. Further, many of these wireless devices will be expected to be small, to be inexpensive, to consume low power, or some combination thereof. Thus, the components that enable wireless communications under these constraints will likewise be expected to be tiny, low-cost, and capable of functioning with less energy use. One such component that facilitates electronic communications is the signal filter. Unfortunately, the filters designed for devices that operate in accordance with the 4G wireless cellular standard are proving inadequate to handle the higher frequencies intended for 5G-capable devices.

In other words, to facilitate the adoption of 5G technologies and the widespread deployment of wireless devices that can provide many new capabilities, existing signal filters should be replaced with those having more-robust designs and superior filtering performance. Consequently, electrical engineers and other designers of electronic devices are striving to develop new signal filters that will enable the promise of 5G technologies to become a reality.

SUMMARY

In an example aspect, an apparatus for enhancing a frequency response of a filtering operation is disclosed. The apparatus includes a transmission-line filter having an input port, an output port, and multiple transmission-line base units. The multiple transmission-line base units are disposed between the input port and the output port and are also coupled to the input port and the output port. Each of the multiple transmission-line base units includes a respective transmission line of multiple transmission lines. At least one transmission-line base unit of the multiple transmission-line base units includes a multi-resonant circuit.

In an example aspect, a system for filtering a signal with a transmission-line filter having an enhanced frequency response is disclosed. The system includes an input port, an output port, and multiple transmission-line base units. The multiple transmission-line base units are disposed in a chained series between the input port and the output port and are also coupled to the input port and the output port. Each of the multiple transmission-line base units includes a respective transmission line of multiple transmission lines. The multiple transmission-line base units include at least one transmission-line base unit that comprises generation means for generating multiple resonant frequencies for the transmission-line filter.

In an example aspect, a method for operating a transmission-line filter with enhanced frequency response is disclosed. The method includes accepting an incoming signal at an input port. The method also includes propagating the incoming signal from the input port along at least one signal pathway to an output port to produce a filtered signal. The method further includes forwarding the filtered signal from the output port. The propagating can include applying the incoming signal to one or more transmission-line base units. To do so, the propagating includes applying the incoming signal to a first transmission-line base unit including a first transmission line. The propagating also includes applying the incoming signal to a second transmission-line base unit including a second transmission line, with the applying including generating multiple resonant frequencies using the second transmission-line base unit. The propagating further includes applying the incoming signal to a third transmission-line base unit including a third transmission line.

In an example aspect, an apparatus for enhancing a frequency response of a filtering operation is disclosed. The apparatus includes a transmission-line filter. The transmission-line filter includes an input port, an output port, and multiple transmission lines disposed between the input port and the output port. The multiple transmission lines include a first transmission line electrically coupled between the input port and a ground, a second transmission line electrically coupled between the output port and the ground, and a third transmission line disposed between the first transmission line and the second transmission line. The second transmission line has a proximal end and a distal end. The transmission-line filter also includes a capacitor electrically coupled to the distal end of the second transmission line.

BRIEF DESCRIPTION OF DRAWINGS

FIG. 3-1 is a schematic diagram illustrating an example transmission-line filter with enhanced frequency response, including multiple transmission-line base units.

FIG. 3-2 is a schematic diagram illustrating another example transmission-line filter with enhanced frequency response.

FIG. 4-1 is a circuit diagram illustrating examples of transmission-line base units with multi-resonance.

FIG. 4-2 is a graph illustrating an example performance of a transmission-line base unit with multi-resonance.

FIG. 5-1 is a circuit diagram illustrating an example transmission-line filter with enhanced frequency response using a shared capacitor that bridges two transmission-line base units.

FIG. 5-2 is a circuit diagram illustrating the example transmission-line filter of FIG. 5-1 with a schematic overlay.

FIG. 5-3 is a perspective rendering that illustrates an example three-dimensional realization of the transmission-line filter of FIG. 5-1.

FIG. 5-4 is a graph illustrating an example performance of the transmission-line filter of FIG. 5-1.

FIG. 7-1 is a circuit diagram illustrating an example transmission-line filter with enhanced frequency response using a shared capacitor that bridges two transmission-line base units and a separate capacitor for another transmission-line base unit.

FIG. 7-2 is a perspective rendering that illustrates an example three-dimensional realization of the transmission-line filter of FIG. 7-1.

FIG. 7-3 is a graph illustrating an example performance of the transmission-line filter of FIG. 7-1.

DETAILED DESCRIPTION

Figure 1:
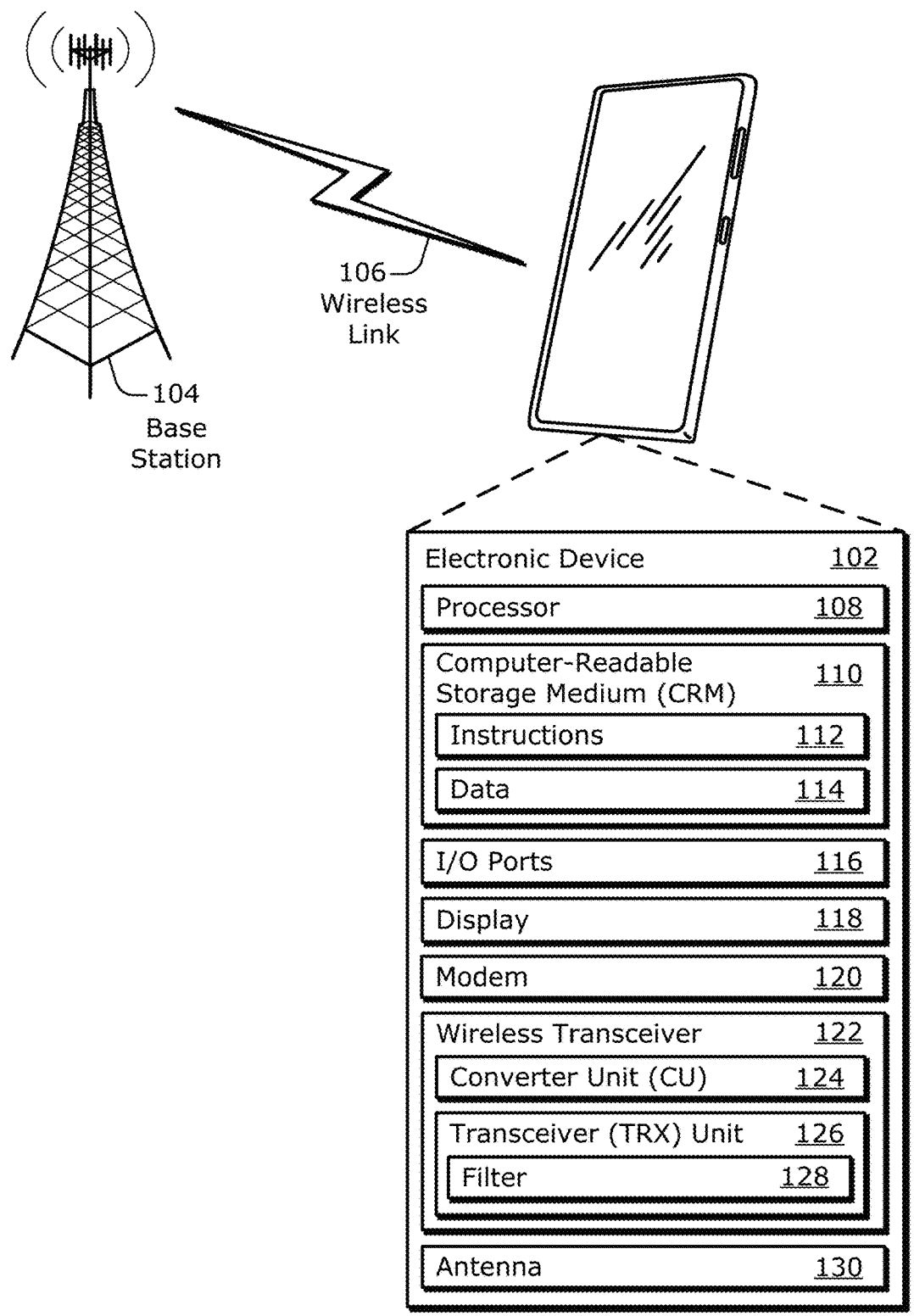
FIG. 1 illustrates an example environment that includes an electronic device with a wireless transceiver in which transmission-line filtering with enhanced frequency response can be implemented.

The arrival of Fifth Generation (5G) wireless systems will bring many new communication possibilities due to the increased bandwidth, greater available spectrum, and lower latency afforded by the implementation of a 5G wireless standard, such as one created by the 3rd Generation Partnership Project (3GPP). This 3GPP 5G wireless standard is intended to enable devices to communicate wireless signals using frequencies of the electromagnetic spectrum that are at or near the super high frequency (SHF) band (e.g., in the 3-30 gigahertz (GHz) range) and the extremely high frequency (EHF) band (e.g., in the 30-300 GHz range) and with wavelengths at or near centimeter and millimeter wavelengths. Communicating at these higher frequencies provides spectrum "headroom" to create an individual signal having a high bandwidth to enable data-intensive transmissions. For example, a communication signal can carry data that occupies several hundred megahertz (MHz) to over one gigahertz (GHz) of electromagnetic spectrum.

Utilizing such individual signals with wide bandwidths enables some of the new technologies that 5G will offer. However, processing these wide-bandwidth signals introduces new difficulties. Signal filtering is part of processing communication signals and is also affected by these new difficulties. A signal filter can be used to isolate a desired signal having a particular frequency range, or frequency band, from other frequencies of the SHF and EHF spectrum. Existing filters, however, struggle to cover a wideband frequency range that will be pertinent to processing wideband signals in accordance with a 5G wireless standard.

Some existing approaches attempt to process a wideband signal by segregating the signal into multiple narrowband parts and then processing each narrowband part separately. Although this approach can be effective in terms of the result, this approach is ineffective in terms of efficiency and feasibility. An electronic device that adopts this approach employs multiple transceiver chains, one for each narrowband segregated part. Each transceiver chain can include respective amplifiers, mixers, filters, and so forth. This duplication is costly and can also cause the corresponding electronic device to be larger and more power hungry. Thus, this approach is infeasible for portable, battery-powered electronic devices, like smart phones and wearable wireless devices.

One type of signal filter is the transmission-line filter. With a transmission-line filter, tiny conductive paths called transmission lines are used to isolate a desired frequency band by attenuating other frequency ranges. A transmission-line filter can be built using multiple transmission-line base units, with each transmission-line base unit including a transmission line. However, existing transmission-line filters also suffer from the wideband problem described above: existing individual transmission-line filters cannot adequately handle a wideband signal. Existing designs mandate a performance tradeoff: data bandwidth versus insertion loss (IL). Incorporating an additional transmission-line base unit can widen a filtering bandwidth. Unfortunately, each additional transmission-line base unit also increases the insertion loss presented by the transmission-line filter, as well as the accessioned increase in X, Y dimensions. The insertion loss represents an amount by which the transmission-line filter reduces signal strength for many, if not most, frequencies. In other words, as insertion loss increases, data present in a desired frequency band is attenuated or suppressed just like signal components in the undesired frequency ranges. Accordingly, existing transmission-line filters are not adept at handling wideband signals.

In contrast, transmission-line filters that are described herein enable wider bandwidths to be passed while filtering undesired frequency ranges without appreciably increasing insertion loss. This can be accomplished by creating additional poles (e.g., transmission poles) in the performance response of a transmission-line filter, as is explained below. Each transmission-line base unit can create at least one pole in the S(1,1) performance response of the corresponding transmission-line filter, with each pole being visible as a notch or a dip in a graph of the S(1,1) performance response. A quantity of poles roughly correlates to a potential bandwidth of a transmission-line filter. In other words, as a transmission-line filter is able to create more poles in this particular S(1,1) performance characteristic, the transmission-line filter is able to increase a width of the potential bandwidth that the filter can handle.

In existing transmission-line filter designs, each transmission-line base unit can create up to one pole per transmission-line base unit. However, transmission-line filter implementations that are described herein can create multiple poles per transmission-line base unit. For example, a given transmission-line base unit can create multiple (e.g., two) poles. As a result, a transmission-line filter with three transmission-line base units can produce, for instance, five poles in the S(1,1) performance response. This translates to a wider available bandwidth for filtering 5G wideband signals.

To create multiple poles for a single transmission-line base unit, the transmission-line base unit includes a multi-resonant circuit in some example implementations. The multi-resonant circuit includes components that resonate at two or more frequencies, which creates two or more corresponding poles. Each pole corresponds to a passband resonance for the associated transmission-line filter. A multi-resonant circuit can be built using a parallel resonant circuit that includes a capacitor (e.g., a component with a capacitive reactance) and an inductor (e.g., a component with an inductive reactance). A multi-resonant circuit can be coupled to a distal end of a transmission line of a transmission-line base unit. In other words, the multi-resonant circuit can be coupled between ground and an end of the transmission line that is opposite a proximal end where a signal that is being filtered propagates between an input port and an output port of the transmission-line filter. With this approach, one or more of the transmission-line base units of a given transmission-line filter can be implemented as a hybrid transmission-line base unit that includes both a transmission line and an inductive-capacitive (LC) tank circuit.

In these manners, a transmission-line filter with a wider frequency bandwidth can be produced by creating additional poles responsive to a multi-resonant circuit generating additional passband resonances. Further, the resulting filter skirts can have sharper drop-offs, and the out-of-band (00B) attenuation can be increased. Because these additional passband resonances are generated without necessarily adding another transmission-line base unit, the insertion loss characteristic of a given transmission-line filter is not appreciably increased. The techniques that are described herein can be employed for many different filters, including those that function as part of a transmit chain or a receive chain, and in different types of devices, including low-cost small ones and more complex or expensive ones.

FIG. 1 illustrates an example environment 100 that includes an electronic device 102 with a wireless transceiver 122 in which transmission-line filtering with enhanced frequency response can be implemented. In the environment 100, the electronic device 102 communicates with a base station 104 through a wireless link 106. As shown, the electronic device 102 is depicted as a smart phone. However, the electronic device 102 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet-of-Things (IoT) device, sensor or security device, asset tracker, and so forth.

The base station 104 communicates with the electronic device 102 via the wireless link 106, which may be implemented as any suitable type of wireless link. Although depicted as a base station tower of a cellular radio network, the base station 104 may represent or be implemented as another device, such as a satellite, terrestrial broadcast tower, access point, peer-to-peer device, mesh network node, fiber optic line, another electronic device generally as described above, and so forth. Hence, the electronic device 102 may communicate with the base station 104 or another device via a wired connection, a wireless connection, or a combination thereof. The wireless link 106 can include a downlink of data or control information communicated from the base station 104 to the electronic device 102 and an uplink of other data or control information communicated from the electronic device 102 to the base station 104. The wireless link 106 may be implemented using any suitable communication protocol or standard, such as 3rd Generation Partnership Project Long-Term Evolution (3GPP LTE), IEEE 802.11, IEEE 802.16, Bluetooth™, and so forth.

The electronic device 102 includes a processor 108 and a computer-readable storage medium 110 (CRM 110). The processor 108 may include any type of processor, such as an application processor or a multi-core processor, that is configured to execute processor-executable instructions (e.g., code) stored by the CRM 110. The CRM 110 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the CRM 110 is implemented to store instructions 112, data 114, and other information of the electronic device 102, and thus the CRM 110 does not include transitory propagating signals or carrier waves.

The electronic device 102 may also include input/output ports 116 (I/O ports 116) or a display 118. The I/O ports 116 enable data exchanges or interaction with other devices, networks, or users. The I/O ports 116 may include serial ports (e.g., universal serial bus (USB) ports), parallel ports, audio ports, infrared (IR) ports, camera or other sensor ports, and so forth. The display 118 can be realized as a screen or projection that presents graphics of the electronic device 102, such as a user interface associated with an operating system, program, or application. Alternatively or additionally, the display 118 may be implemented as a display port or virtual interface through which graphical content of the electronic device 102 is communicated or presented.

For communication purposes, the electronic device 102 also includes a modem 120, a wireless transceiver 122, and an antenna 130. The wireless transceiver 122 provides connectivity to respective networks and other electronic devices connected therewith using radio-frequency (RF) wireless signals. Additionally or alternatively, the electronic device 102 may include a wired transceiver, such as an Ethernet or fiber optic interface for communicating over a personal or local network, an intranet, or the Internet. The wireless transceiver 122 may facilitate communication over any suitable type of wireless network, such as a wireless local area network (LAN) (WLAN), a peer-to-peer (P2P) network, a mesh network, a cellular network, a wireless wide-area-network (WWAN), a navigational network (e.g., the Global Positioning System (GPS) of North America or another Global Navigation Satellite System (GNSS)), and/or a wireless personal-area-network (WPAN). In the context of the example environment 100, the wireless transceiver 122 enables the electronic device 102 to communicate with the base station 104 and networks connected therewith. However, the wireless transceiver 122 can enable the electronic device 102 to communicate with other devices or using alternative wireless networks.

The modem 120, such as a baseband modem, may be implemented as a system on-chip (SoC) that provides a digital communication interface for data, voice, messaging, and other applications of the electronic device 102. The modem 120 may also include baseband circuitry to perform high-rate sampling processes that can include analog-to-digital conversion (ADC), digital-to-analog conversion (DAC), gain correction, skew correction, frequency translation, and so forth. The modem 120 may also include logic to perform in-phase/quadrature (I/Q) operations, such as synthesis, encoding, modulation, demodulation, and decoding. More generally, the modem 120 may be realized as a digital signal processor (DSP) or a communications-oriented processor that is configured to perform signal processing to support communications via one or more networks. Alternatively, ADC or DAC operations may be performed by a separate component or another illustrated component, such as the wireless transceiver 122 as shown.

The wireless transceiver 122 can include circuitry, logic, and other hardware for transmitting or receiving a wireless signal for at least one communication frequency band. In operation, the wireless transceiver 122 can implement at least one, e.g., radio-frequency transceiver unit to process data and/or signals associated with communicating data of the electronic device 102 via the antenna 130. Generally, the wireless transceiver 122 can include filters, switches, amplifiers, mixers, and so forth for routing and conditioning signals that are transmitted or received via the antenna 130. As shown, the wireless transceiver 122 includes at least one converter unit 124 (CU) (e.g., for ADC or DAC operations) and at least one transceiver unit 126 (TRX unit). The transceiver unit 126 includes at least one filter 128.

In some cases, components of the wireless transceiver 122, or a transceiver unit 126 thereof, are implemented as separate receiver and transmitter entities. Additionally or alternatively, the wireless transceiver 122 can be realized using multiple or different sections to implement respective receiving and transmitting operations (e.g., using separate receive and transmit chains). Example implementations of a transceiver unit 126, including a filter 128, are described below with reference to FIG. 2. Examples in which the filter 128 is implemented as a transmission-line filter with enhanced frequency response are described from a schematic perspective with reference to FIGS. 3-1 and 3-2. Additional examples of a transmission-line filter with enhanced frequency response are described from circuit, performance, and three-dimensional (3D) realization perspectives with reference to FIGS. 4-1 to 7-3.

Figure 2:
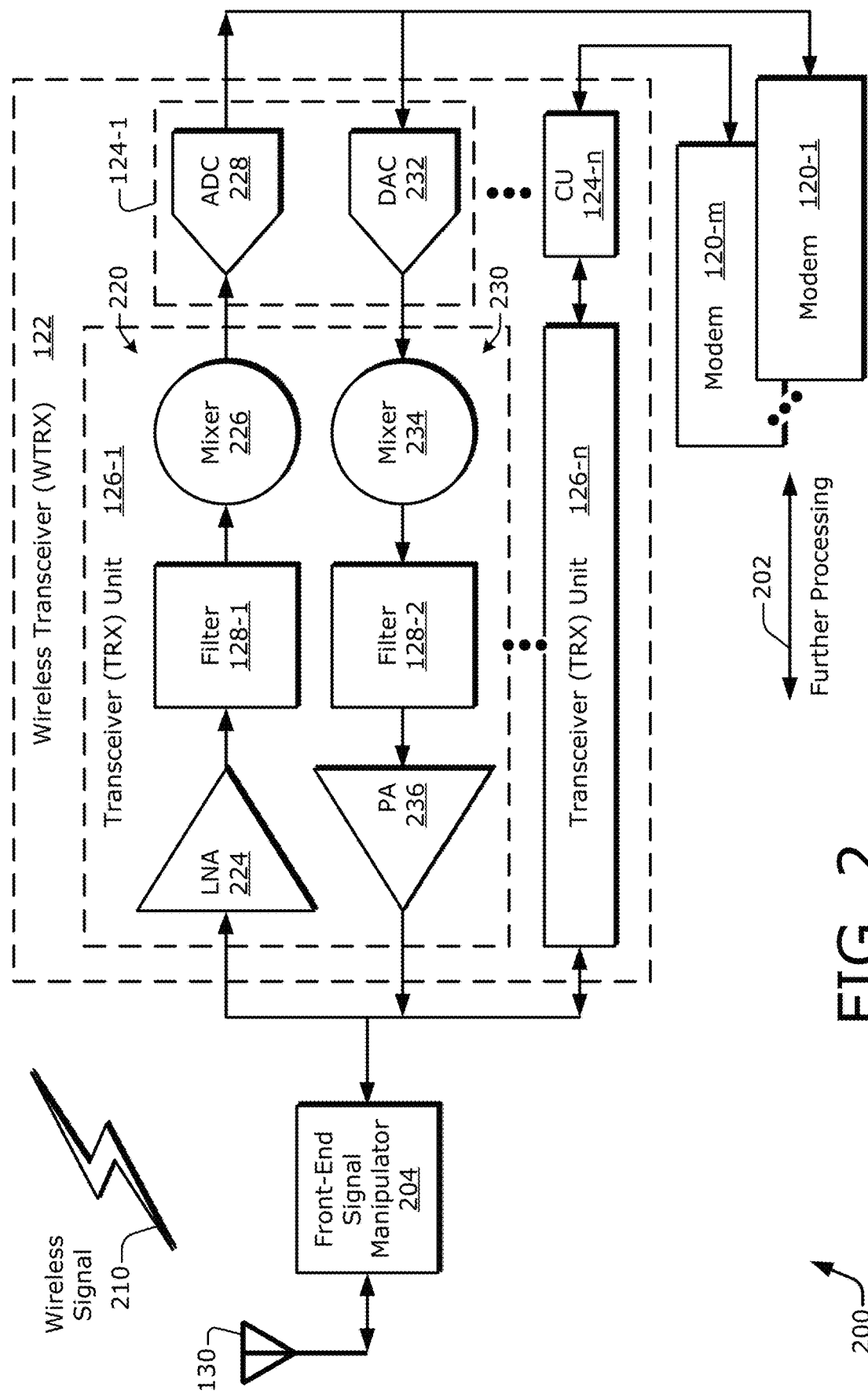
FIG. 2 illustrates an example wireless transceiver that includes a filter as part of a receiver and another filter as part of a transmitter, in which either filter can be realized as a transmission-line filter with enhanced frequency response.

FIG. 2 illustrates, at 200, an example of a wireless transceiver 122 that includes a filter 128 that can be realized as a transmission-line filter with enhanced frequency response. The filter 128 can be implemented as a filter 128-1 along a receive chain, as a filter 128-2 along a transmit chain, or as another filter that is deployed elsewhere in an electronic device. As illustrated from left to right, the antenna 130 is coupled to the wireless transceiver 122 via a front-end signal manipulator 204, and the wireless transceiver 122 is coupled to at least one modem 120. The front-end signal manipulator 204 can be implemented as a front-end filter, a diplexer, a multiplexer, an extractor, some combination thereof, and so forth. The wireless transceiver 122 includes one or more transceiver units 126-1 . . . 126-$n$, with "n" representing a positive integer. In some devices, each of the multiple wireless transceiver units 122-1 to 122-$n$ is coupled to at least one of multiple modems 120-1 . . . 120-$m$, with "m" representing a positive integer.

Thus, in FIG. 2, multiple transceiver units 126-1 to 126-$n$ are shown. As part of the wireless transceiver 122 (WTRX), each transceiver unit 126-1 to 126-$n$ is respectively coupled to an associated converter unit 124 (CU) of multiple converter units 124-1 . . . 124-$n$. Each converter unit 124, as depicted at the converter unit 124-1, can include an analog-to-digital converter 228 (ADC) or a digital-to-analog converter 232 (DAC). As shown, the transceiver unit 126-1 is coupled to the modem 120-1 (e.g., via the converter unit 124-1), and the transceiver unit 126-$n$ is coupled to the modem 120-$m$. However, multiple transceiver units 126 can be coupled to a same modem 120. Although only certain components are explicitly depicted in FIG. 2, the wireless transceiver 122 may include other components. Further, the converter units 124-1 to 124-$n$ may be separate from the wireless transceiver 122, such as by being independent or a part of a modem 120.

The transceiver unit 126-1 includes a receiver 220 (or receive chain) and a transmitter 230 (or transmit chain). The receiver 220 includes a low-noise amplifier 224 (LNA 224), the filter 128-1, and a mixer 226 for frequency downconversion. The transmitter 230 includes a mixer 234 for up-conversion, the filter 128-2, and a power amplifier 236 (PA 236). However, the transceiver unit 126-1 can include other components, such as additional amplifiers or filters or multiple mixers, that are disposed anywhere along the depicted receive and transmit chains. These example components can at least partially implement a radio-frequency front-end (RFFE) for the associated electronic device 102.

As shown for the receiver 220 of the transceiver unit 126-1, the antenna 130 is coupled to the low-noise amplifier 224 via the front-end signal manipulator 204, and the low-noise amplifier 224 is coupled to the filter 128-1. The filter 128-1 is coupled to the mixer 226, and the mixer 226 is coupled to the ADC 228 for the receive chain. The ADC 228 is coupled to, or is part of, the modem 120-1. As shown for the transmit chain, the DAC 232 is coupled to, or is part of, the modem 120-1. The DAC 232 is also coupled to the transmitter 230 of the transceiver unit 126-1 via the mixer 234. The mixer 234 is coupled to the filter 128-2, and the filter 128-2 is coupled to the power amplifier 236. The power amplifier 236 is coupled to the antenna 130 via the front-end signal manipulator 204. The antenna 130 is coupled to the transceiver unit 126-$n$, and the transceiver unit 126-$n$ is coupled to the converter unit 124-$n$, which is coupled to the modem 120-$m$. Although only one antenna is shown, an electronic device 102 can include multiple antennas or an antenna array.

An example signal-receiving operation that includes the receiver 220 of the transceiver unit 126-1 is now described. As part of the signal-receiving operation, the antenna 130 receives a wireless signal 210. The antenna 130 can be implemented as, e.g., a diversity antenna. The antenna 130 provides the wireless signal 210 to at least one selected transceiver unit 126, which is the transceiver unit 126-1 here, via the front-end signal manipulator 204. Thus, the antenna 130 provides the wireless signal 210 to the low-noise amplifier 224 of the transceiver unit 126-1 after manipulation by the front-end signal manipulator 204. The low-noise amplifier 224 amplifies the manipulated signal to produce an amplified signal. The low-noise amplifier 224 provides the amplified signal to the filter 128-1. The filter 128-1 filters (e.g., low-pass filters or bandpass filters) the amplified signal by attenuating some range or ranges of frequencies to produce a filtered signal that has one or more frequency bands attenuated. The filter 128-1 provides the filtered signal to the mixer 226.

The mixer 226 performs a frequency conversion operation on the filtered signal to down-convert from one frequency to a lower frequency, such as from a radio frequency (RF) to an intermediate frequency (IF) or a baseband frequency (BBF). The mixer 226 can perform the frequency down-conversion in a single conversion step, or through multiple conversion steps. Thus, the mixer 226 performs a frequency down-conversion operation on the filtered signal to produce a down-converted signal and provides the down-converted signal to the ADC 228. The ADC 228 converts the analog down-converted signal to a digital signal. The ADC 228 provides the digital signal to the modem 120-1. The modem 120-1 can perform demodulation, decoding, and so forth on the digital signal to produce a data signal. The modem 120-1 then provides the data signal to other components, such as a device processor, for further processing at 202 (e.g., for processing at an application level).

As part of an example signal-transmitting operation, the DAC 232 receives a digital signal from the modem 120-1. The DAC 232 converts the digital signal to an analog signal, which is at a baseband or intermediate frequency. The mixer 234 accepts the analog signal from the DAC 232 and upconverts the analog signal to a higher frequency, such as an RF frequency to produce an RF signal. The mixer 234 provides the RF signal to the filter 128-2. The filter 128-2 filters the RF signal to attenuate one or more frequency ranges and produces a filtered signal, which is provided to the power amplifier 236. The power amplifier 236 amplifies the filtered signal to generate an amplified signal. The power amplifier 236 provides the amplified signal to the antenna 130 via the front-end signal manipulator 204 for emanation as the wireless signal 210.

Although certain components are depicted at 200, the receiver 220 or the transmitter 230 may include different components, more or fewer components, or an alternative order of components. For example, another filter or another mixer may be disposed along the receive chain between the antenna 130 and the low-noise amplifier 224 such that a received wireless signal 210 is partially processed (e.g., filtered at least once by the front-end signal manipulator 204) prior to being routed to the low-noise amplifier 224.

Figures 1, 3:
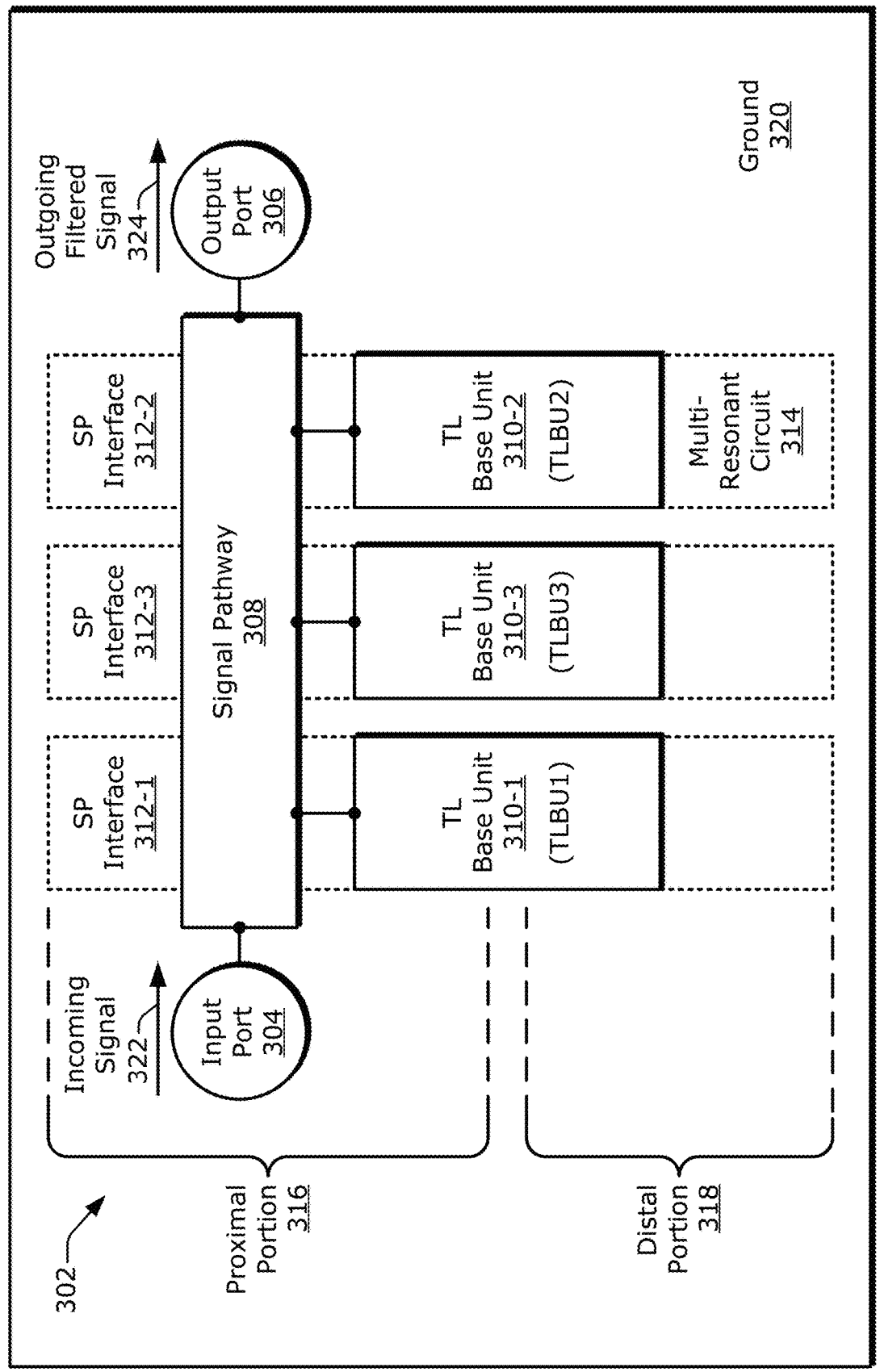
Figures 2, 3:
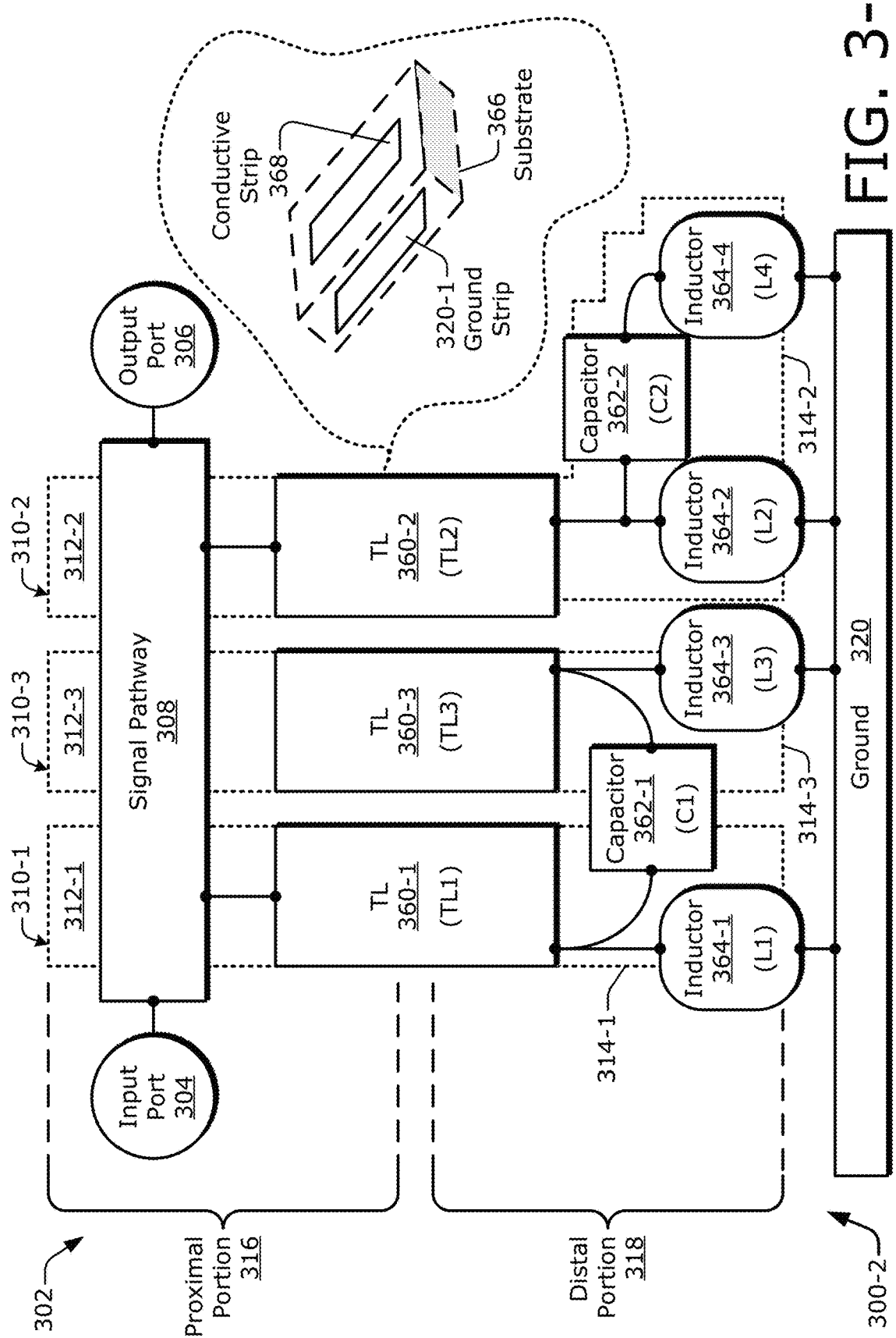

FIG. 3-1 is a schematic diagram 300-1 illustrating an example transmission-line filter 302 with enhanced frequency response. The transmission-line filter 302 can be used to implement the filter 128 of FIG. 1; the filter 128-1 of the receiver 220 of FIG. 2; the filter 128-2 of the transmitter 230 of FIG. 2; another signal filter that is located on a substrate, inside a package, or within an electronic device generally; and so forth. FIG. 3-1 also includes a ground 320. The ground 320 is depicted as a solid ground plane; however, the ground 320 may be implemented in an alternative manner, such as a discontinuous plane on a given metal layer of an integrated circuit chip, a ground line, a ground node, some combination thereof, and so forth.

As shown for some implementations, the transmission-line filter 302 includes an input port 304, an output port 306, a signal pathway 308, and multiple transmission-line base units (TLBU). Specifically, three transmission-line base units 310-1, 310-2, and 310-3 are depicted. However, less than three or more than three transmission-line base units may alternatively be implemented. The signal pathway 308 is coupled to and is disposed between the input port 304 and the output port 306. Although a single signal pathway 308 is explicitly depicted as being disposed between the two ports in FIG. 3-1, a transmission-line filter 302 may include multiple signal pathways. Thus, an incoming signal 322 propagating between the input port 304 and the output port 306 may take one signal pathway 308 of potentially multiple signal pathways or may "simultaneously" take multiple signal pathways to traverse the multiple transmission-line base units 310-1 to 310-3 while propagating between the two ports. The multiple transmission-line base units 310-1 to 310-3 are disposed in a chained series between the input port 304 and the output port 306. The multiple transmission-line base units 310-1 to 310-3 can be disposed in a chained series in the sense that the base units are fabricated together on a substrate in a spatial row or line, in the sense that one or more of the base units are electrically coupled together in a row or in a series connection, in the sense that one or more of the base units are magnetically linked together in a row, some combination thereof, and so forth. Further, the multiple transmission-line base units 310-1 to 310-3 are arranged to extend substantially perpendicular to the signal pathway 308 and thus also substantially perpendicular to a direction of travel or propagation of the incoming signal 322. The multiple transmission-line base units 310-1 to 310-3 are also arranged to be substantially parallel with respect to each other.

Each transmission-line base unit 310 includes a respective signal-pathway interface 312 (SP interface 312). Thus, a first transmission-line base unit 310-1 (TLBU1) includes a first signal-pathway interface 312-1, a second transmission-line base unit 310-2 (TLBU2) includes a second signal-pathway interface 312-2, and a third transmission-line base unit 310-3 (TLBU3) includes a third signal-pathway interface 312-3. Each respective signal-pathway interface 312 couples the corresponding respective transmission-line base unit 310 to the at least one signal pathway 308 via an electrical coupling or a magnetic coupling.

In operation, an incoming signal 322 arrives or is accepted at the input port 304. The incoming signal 322 propagates over the at least one signal pathway 308. During this propagation, the incoming signal 322 is affected by the multiple transmission-line base units 310-1 to 310-3. For example, certain targeted frequencies or at least one frequency band can be attenuated to filter the targeted frequencies or frequency band from the signal. After the filtering, a filtered signal is produced. The transmission-line filter 302 provides this filtered signal as an outgoing filtered signal 324 at the output port 306. In the receiver 220 (of FIG. 2), the filter 128-1 has an input port 304 on an antenna side and an output port 306 on a modem side. In the transmitter 230, the filter 128-2 has an input port 304 on the modem side and an output port 306 on the antenna side.

In example implementations, at least one transmission-line base unit 310 of the multiple transmission-line base units 310-1 to 310-3 includes a multi-resonant circuit 314. In FIG. 3-1, the second transmission-line base unit 310-2 includes the illustrated multi-resonant circuit 314. However, more than one transmission-line base unit 310 may include a multi-resonant circuit 314, or two or more transmission-line base units may share a common multi-resonant circuit 314. The transmission-line filter 302 can be separated into a proximal portion 316 and a distal portion 318. The proximal portion 316 can be disposed at, or correspond to, the signal pathway 308, an associated signal-pathway interface 312 of a given transmission-line base unit 310, and part of an associated transmission line (not shown in FIG. 3-1) of the given transmission-line base unit 310. The distal portion 318 is located away from the signal pathway 308 and opposite the proximal portion 316. Thus, each respective transmission-line base unit 310 can extend away from the signal pathway 308 to the respective distal portion 318 thereof. The distal portion 318 can correspond to a part of the associated transmission line of the given transmission-line base unit 310 that is remote from the signal pathway 308 and can correspond to an associated multi-resonant circuit 314. For example, the distal portion 318 can correspond to no more than approximately the remote half of an associated transmission line of a given transmission-line base unit 310, as well as any other components located at a distal end of the transmission line.

Each multi-resonant circuit 314 includes multiple components that jointly resonate with respect to at least two frequencies. A multi-resonant circuit 314 can therefore provide at least one generation mechanism for generating multiple resonant frequencies for the associated transmission-line filter 302. This enables a single transmission-line base unit 310 to create at least two poles in an S(1,1) parameter profile that is indicative of an input reflection performance of the transmission-line filter 302 with enhanced frequency response. The multiple poles per transmission-line base unit 310 also increases a width of an S(2,1) parameter profile that is indicative of an input-to-output transfer performance of the transmission-line filter 302. These "S," or scattering, parameters are described below with reference to the graphs of FIGS. 4-2, 5-4, and 7-3. Next, however, example components for a transmission-line base unit 310 and a multi-resonant circuit 314 thereof are described with reference to FIG. 3-2.

FIG. 3-2 is a schematic diagram 300-2 illustrating another example transmission-line filter 302 with enhanced frequency response. In FIG. 3-2, example components for the multiple transmission-line base units 310-1 to 310-3 are shown. Each respective transmission-line base unit 310-1, 310-2, and 310-3 includes a respective transmission line 360-1, 360-2, and 360-3. Thus, the first transmission-line base unit 310-1 includes a first transmission line 360-1, the second transmission-line base unit 310-2 includes a second transmission line 360-2, and the third transmission-line base unit 310-3 includes a third transmission line 360-3. Further, in this example, each respective transmission-line base unit 310-1, 310-2, and 310-3 includes a respective multi-resonant circuit 314-1, 314-2, and 314-3. Consequently, the first transmission line 360-1 is coupled to a first multi-resonant circuit 314-1, the second transmission line 360-2 is coupled to a second multi-resonant circuit 314-2, and the third transmission line 360-3 is coupled to a third multi-resonant circuit 314-3.

In example implementations, each transmission line 360 includes, as shown with regard to the second transmission line 360-2, a conductive strip 368 and a ground strip 320-1. Thus, each of the multiple transmission lines 360-1 to 360-3 can include a respective conductive strip 368 of multiple conductive strips. The multiple conductive strips are arranged substantially in parallel with respect to each other and substantially perpendicular to the signal pathway 308. For a given transmission line 360, the conductive strip 368 and the ground strip 320-1 are positioned in a parallel arrangement with respect to each other. The ground strip 320-1 can be realized as part of a ground plane for the ground 320. In operation, the second transmission line 360-2 is configured to resonate at an operating frequency of (e.g., a frequency that is to be permitted to pass or that is to be rejected by) the transmission-line filter 302. The conductive strip 368 has multiple dimensions, such as a length and a width. The length of the conductive strip 368 of the second transmission-line 360-2 is dimensioned based on a wavelength of the operating frequency. For example, the length of the conductive strip 368 can be less than approximately one-half (<0.5) of the wavelength of the operating frequency of the second transmission-line base unit 310-2.

As shown, the conductive strip 368 is separated from the ground strip 320-1 by a substrate 366. The substrate 366 can comprise a glass material, a printed circuit board (PCB) material, a semiconductor material, some combination thereof, and so forth. In some aspects, a ground plane 320 is disposed on a side of the substrate 366. At least a portion of the multiple transmission lines 360-1 to 360-3 are disposed on another side of the substrate 366, with the side of the substrate 366 with the ground plane 320 being opposite the other side of the substrate 366 with the multiple transmission-line base units. In such a case, the ground plane 320 can include multiple respective ground strips 320-1 for respective ones of the multiple transmission lines 360-1 to 360-3.

Each multi-resonant circuit 314 can be configured to resonate at two or more frequencies. Each multi-resonant circuit 314 can be implemented as a parallel resonant circuit that includes at least one capacitor 362 and at least one inductor 364. Each parallel resonant circuit can be configured to have parallel paths between a transmission line 360 and the ground 320. Each path of the parallel paths includes a capacitor 362, an inductor 364, or both a capacitor 362 and an inductor 364. As shown in FIG. 3-2, the first multi-resonant circuit 314-1 and the third multi-resonant circuit 314-3 share a capacitor 362-1 to establish a common multi-resonant circuit that is represented by the multi-resonant circuit 314-1 and the multi-resonant circuit 314-3.

In example implementations, each respective transmission line 360-1, 360-2, and 360-3 includes a respective proximal end corresponding to the proximal portion 316 and a respective distal end corresponding to the distal portion 318. Thus, the proximal end of a given transmission line 360 is closer to the signal pathway 302 (e.g., the input port 304 or the output port 306) than is the distal end of the given transmission line. A distal end of each respective transmission line 360-1, 360-2, and 360-3 is coupled to the ground 320 via a respective inductor 364-1, 364-2, and 364-3. Thus, a first inductor 364-1 is coupled between the first transmission line 360-1 and the ground 320, a second inductor 364-2 is coupled between the second transmission line 360-2 and the ground 320, and a third inductor 364-3 is coupled between the third transmission line 360-3 and the ground 320. Each inductor 364 can be implemented as an architected or dedicated inductor or as another component with an intrinsic inductance, such as a vertical interconnect access (via), as is described below.

For the first multi-resonant circuit 314-1 and the third multi-resonant circuit 314-3, a capacitor 362-1 is coupled between the first transmission line 360-1 and the third transmission line 360-3 at the first inductor 364-1 and the third inductor 364-3, respectively. This creates a parallel coupling between the first transmission line 360-1 and the third transmission line 360-3. For the second multi-resonant circuit 314-2, a capacitor 362-2 is coupled in series with an inductor 364-4 between the second transmission line 360-2 and the ground 320. This series-connection is coupled in parallel with the second inductor 364-2 at a distal end of the second transmission line 360-2 and the ground 320. Thus, a combination of at least one capacitor 362 (Cx) and at least one inductor 364 (Lx) can provide at least one resonance mechanism for establishing a parallel resonance between a respective transmission line 360 (TLx) of at least one transmission-line base unit 310 (TLBUx) and a ground 320.

Figures 1, 4:
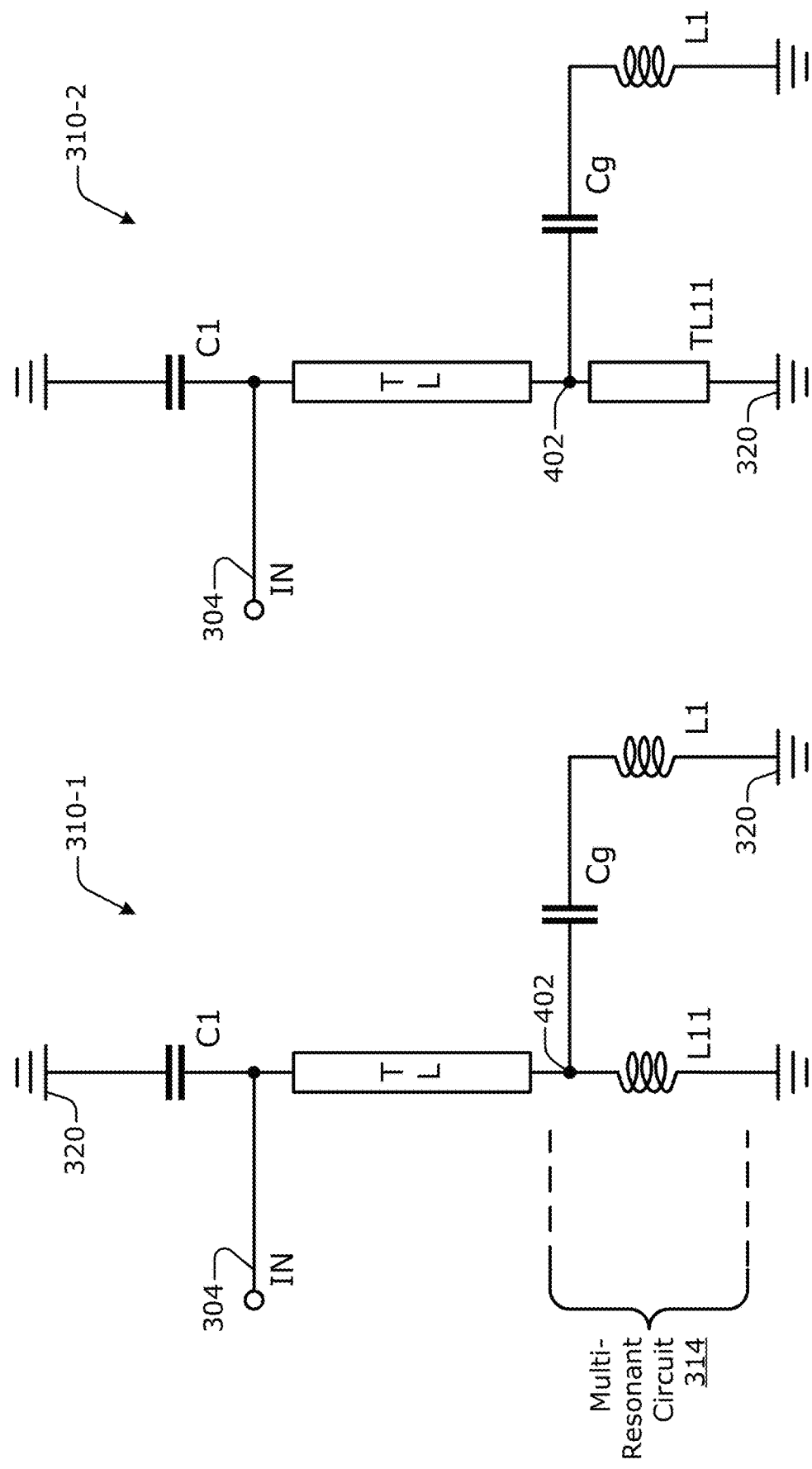
Figures 2, 4:
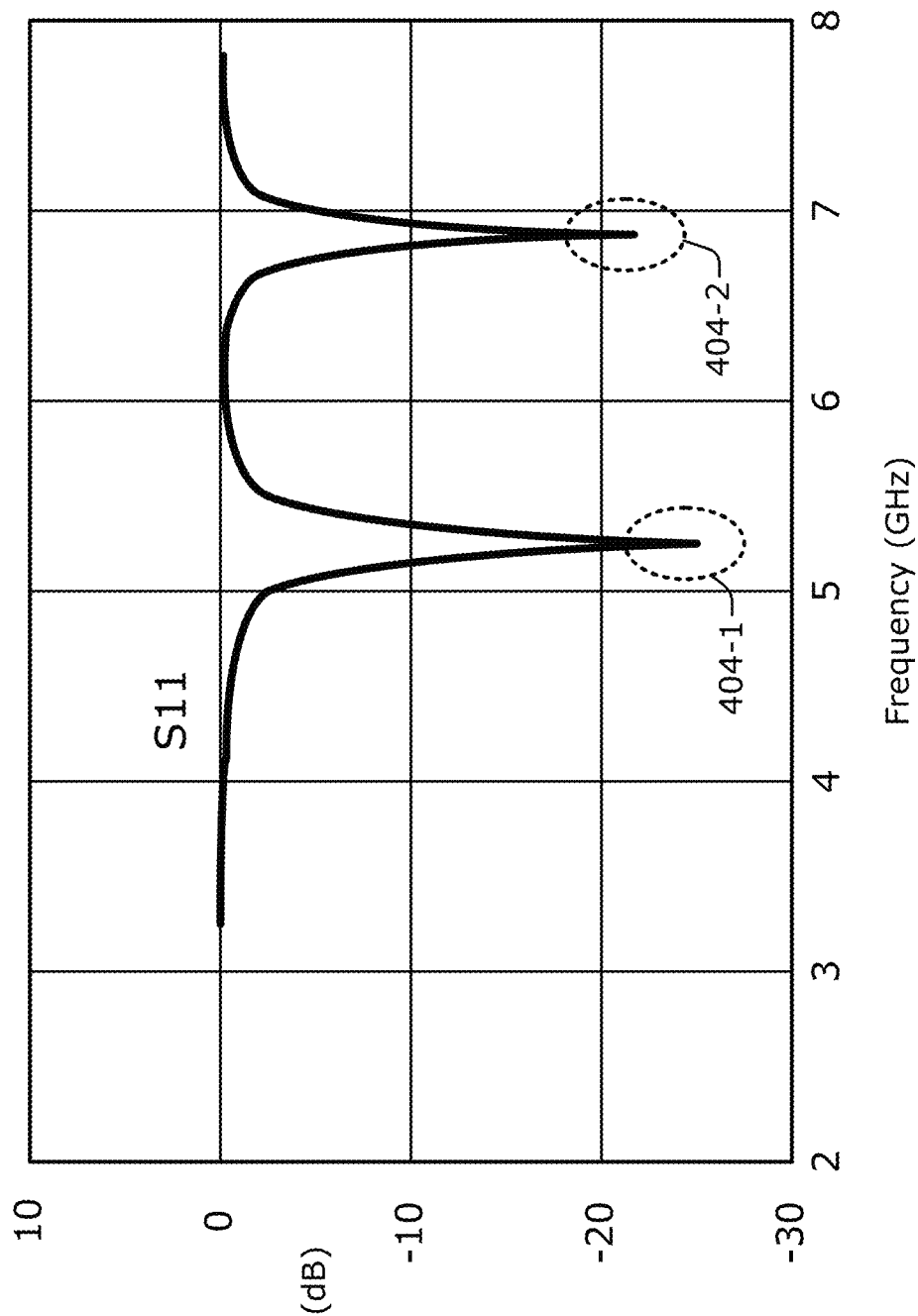

FIG. 4-1 is a circuit diagram 400-1 illustrating examples of transmission-line base units 310-1 and 310-2 with multi-resonance. Each of the illustrated examples are shown as being directly electrically connected to an input port 304 (IN 304). However, the described circuits and performance characteristics are also applicable to transmission-line base units that are directly electrically connected to an output port 306 (e.g., of FIG. 3-2), "internal" transmission-line base units that are not directly connected to an input or an output, "external" transmission-line base units that are magnetically or indirectly connected to an input or an output port, and so forth.

As illustrated, a first transmission-line base unit 310-1 includes a capacitor C1 coupled between the input node and the ground 320. A transmission line TL is coupled between the input node and a node 402, and an inductor L11 is coupled between the node 402 and the ground 320. Thus, the transmission line TL is coupled in series with the inductor L11 between the input node and the ground 320. A capacitor Cg is coupled in series with another inductor L1 between the node 402 and the ground 320. Thus, the capacitor Cg and the other inductor L1 form a series-connection that is coupled in parallel with the inductor L11 between the node 402 and the ground 320.

A second transmission-line base unit 310-2 is constructed similarly to the first transmission-line base unit 310-1. However, an inductor is replaced with a transmission line. Specifically, the inductor L11 in the first transmission-line base unit 310-1 is replaced with a transmission line TL11 in the second transmission-line base unit 310-2. The transmission line TL11 is therefore coupled between the node 402 and the ground 320. In both cases, parallel resonance circuitry is formed to provide a respective multi-resonant circuit 314 (of FIGS. 3-1 and 3-2) for each respective transmission-line base unit 310. Each multi-resonant circuit 314 comprises a doubly-resonant circuit in these examples. Thus, the multi-resonant circuit 314 resonates at two different frequencies. This creates two poles in the S(1,1) parameter performance for the associated transmission-line filter 302.

FIG. 4-2 is a graph 400-2 illustrating an example performance of a transmission-line base unit with multi-resonance. The graph 400-2 has an abscissa/horizontal axis of frequency denoted in gigahertz (GHz) and a ordinate/vertical axis of signal strength denoted in decibels (dB). The decibels extend from −30 to 10 dB, and the frequencies extend from 2 to 8 GHz. An S(1,1) parameter (S11) is graphed.

The S(1,1) parameter of the graph 400-2 corresponds to the transmission-line base units 310-1 and 310-2 of FIG. 4-1. Accordingly, two resonant frequencies are generated. These two resonant frequencies manifest in the S(1,1) parameter characteristics as two poles 404-1 and 404-2, which are visible as notches, dips, or troughs in the graph 400-2. In this example, the pole 404-1 is located approximately at 5.2 GHz and −26 dB, and the pole 404-2 is located approximately at 6.8 GHz and −22 dB. However, these values are merely examples, for both the frequencies and the decibel levels may differ in different implementations based on values of the capacitor, inductor, or transmission line deployed in a given multi-resonant circuit 314 or the transmission-line base unit thereof. The frequency separation or width between these two poles 404-1 and 404-2 can translate to, e.g., a wider passband for a transmission-line filter 302, as is described below with reference to FIGS. 5-1 to 5-4, and particularly FIG. 5-4 which graphs an S(1,1) parameter in concert with a corresponding S(2,1) parameter to represent the passband.

Figures 1, 5:
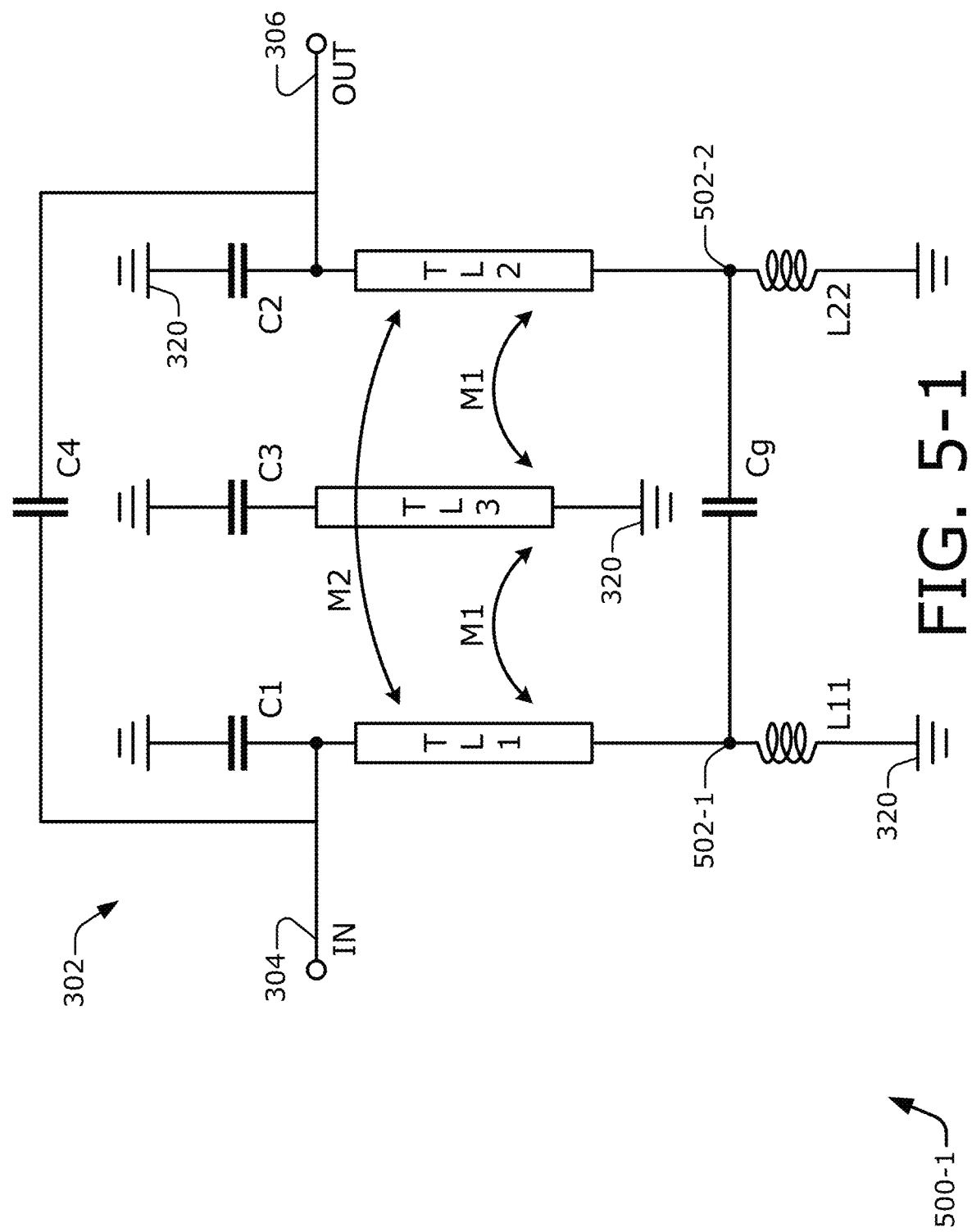
Figures 2, 5:
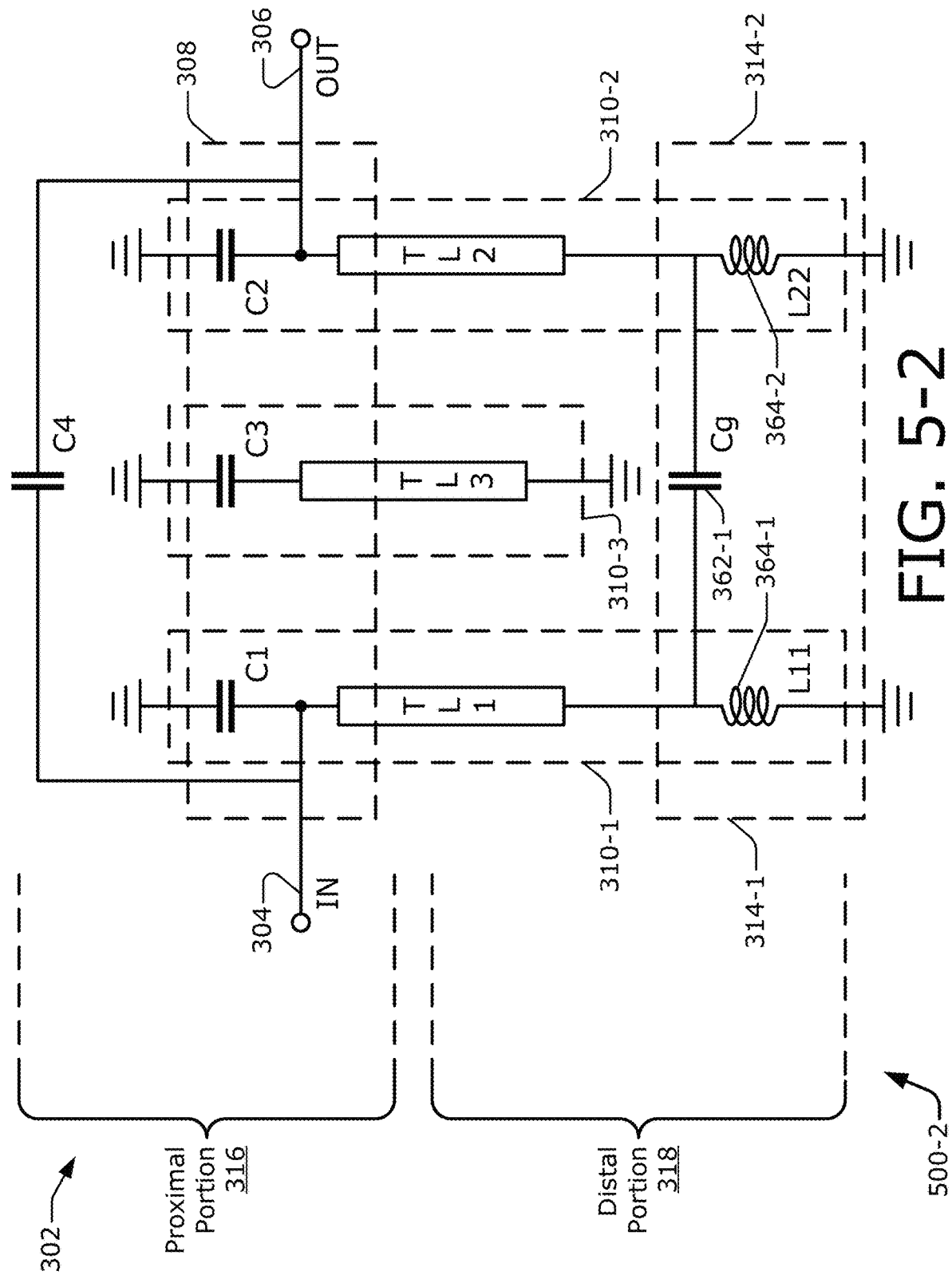
Figures 3, 5:
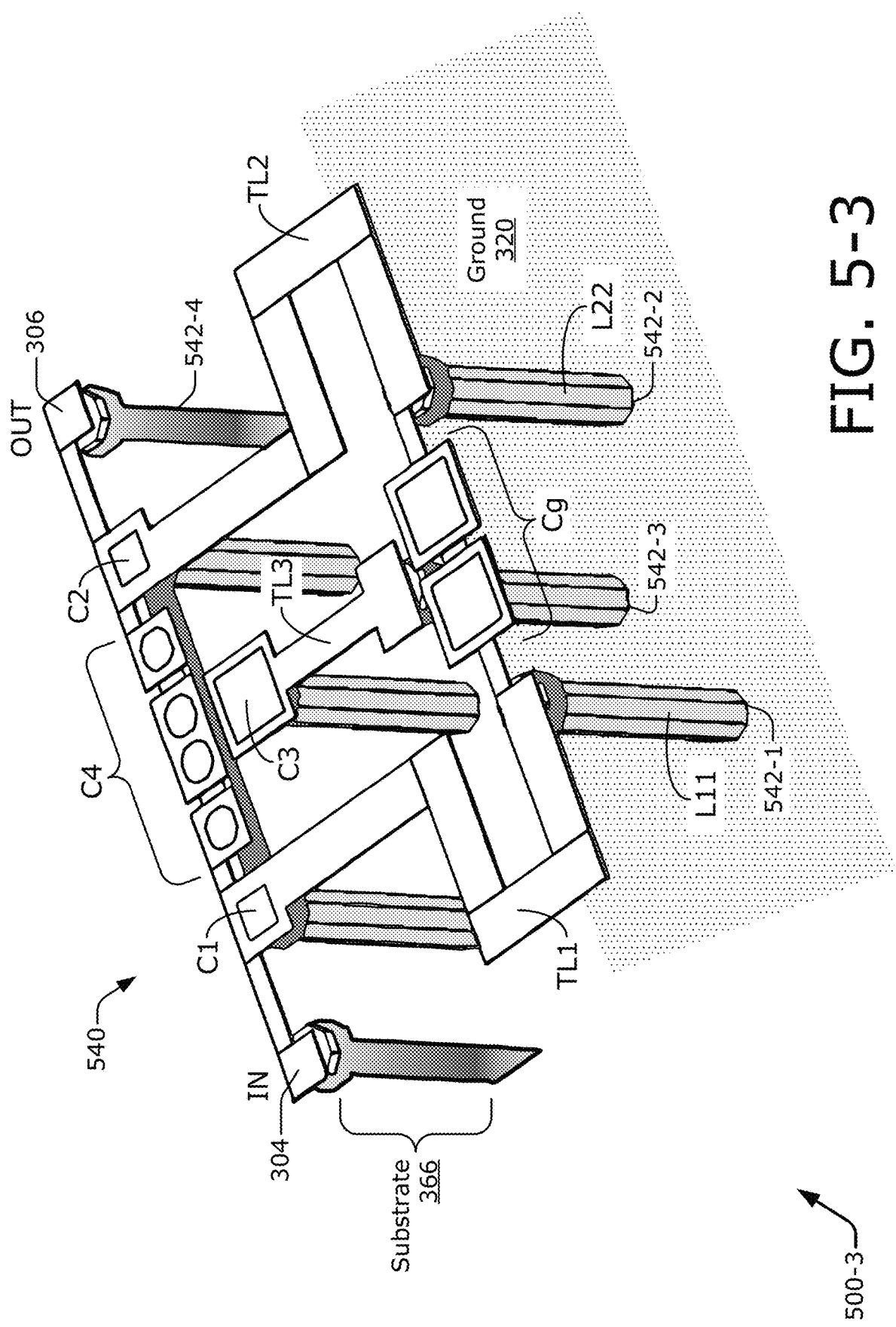
Figures 4, 5:
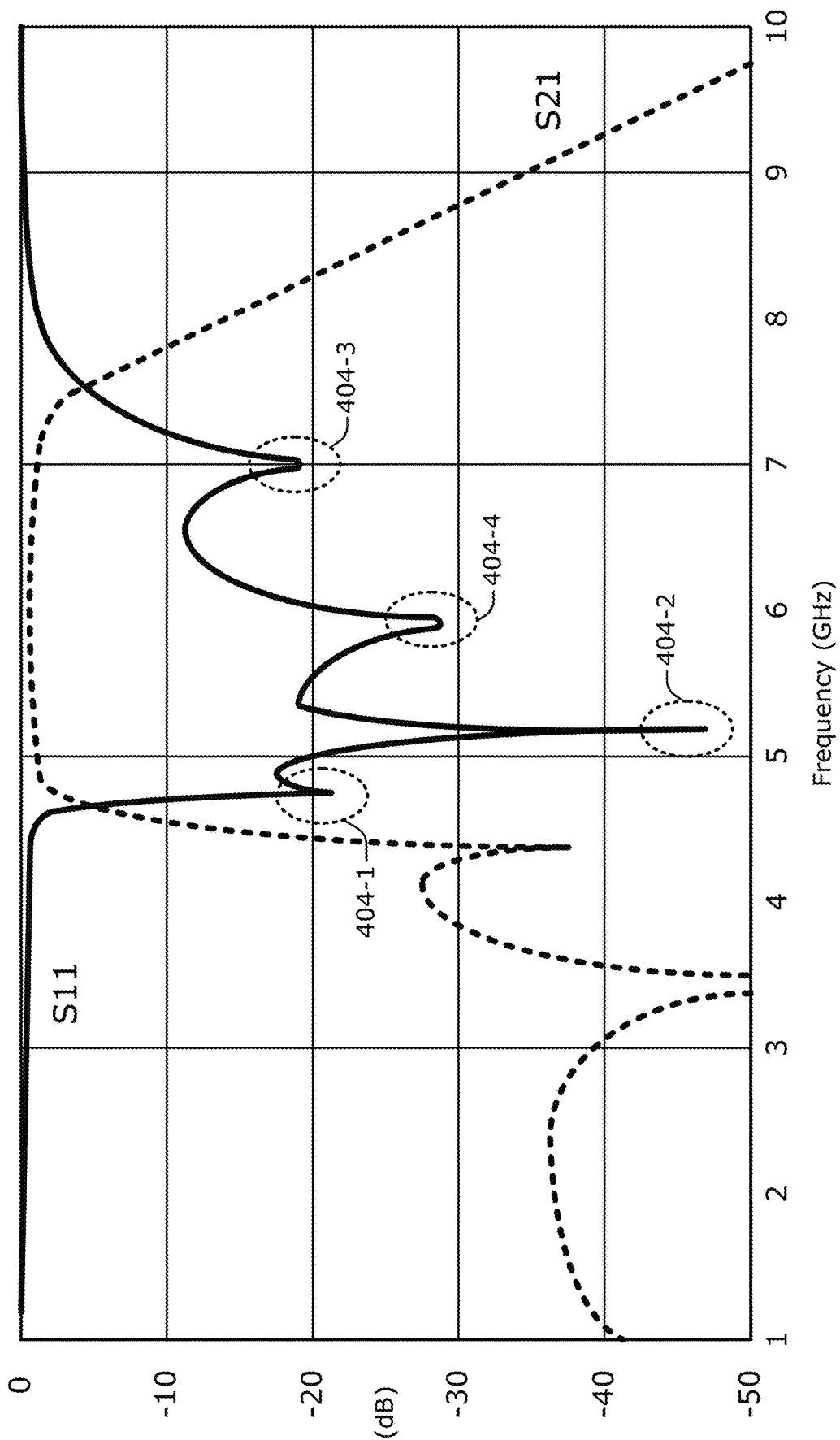

FIG. 5-1 is a circuit diagram 500-1 illustrating an example transmission-line filter 302 with enhanced frequency response using a shared capacitor Cg that bridges two transmission-line base units. The transmission-line filter 302 includes three transmission-line base units disposed in a chained series between the input port 304 and the output port 306. A capacitor C4 is coupled between the input port 304 and the output port 306 to electrically connect the two ports.

As illustrated, a first, or input, transmission-line base unit on the left includes a capacitor C1, a transmission line TL1, and an inductor L11, which are coupled together in series between two ground nodes 320. A node 502-1 is located between the transmission line TL1 and the inductor L11. A second, or output, transmission-line base unit on the right includes a capacitor C2, a transmission line TL2, and an inductor L22, which are coupled together in series between two ground nodes 320. A node 502-2 is located between the transmission line TL2 and the inductor L22. A third, or internal, transmission-line base unit is disposed between the first and second transmission-line base units. The third transmission-line base unit includes a capacitor C3 and a transmission line TL3, which are coupled together in series between two ground nodes 320.

In this example, the capacitor Cg is coupled between the first and second transmission-line base units at the node 502-1 and the node 502-2, respectively. Thus, the capacitor Cg is shared between the first and second transmission-line base units such that each includes a common multi-resonant circuit with overlapping components. The common multi-resonant circuit is coupled to the transmission-line base units at different nodes. The multi-resonant circuit includes at least one parallel resonant circuit. For the first transmission-line base unit, the parallel resonant circuit includes the inductor L11 in parallel with the series-connected capacitor Cg and inductor L22 via the node 502-1. For the second transmission-line base unit, the parallel resonant circuit includes the inductor L22 in parallel with the series-connected capacitor Cg and inductor L11 via the node 502-2.

As explicitly indicated in FIG. 5-1, the multiple transmission-line base units can be coupled magnetically. For example, the first transmission line TL1 can have a magnetic coupling M1 with the third transmission line TL3, and the second transmission line TL2 can have another magnetic coupling M1 with the third transmission line TL3. Further, the first transmission line TL1 can have a magnetic coupling M2 with the second transmission line TL2. Here, the third transmission-line base unit is electrically floating with respect to the input port 304 and the output port 306. But the third transmission-line base unit is magnetically coupled to the other two transmission-line base units via the magnetic couplings M1. However, the third transmission-line base unit can also be electrically coupled to the input port 304 and the output port 306, e.g., directly or via a capacitor on either side leading to the input node and the output node (or via one or more other components). Although such magnetic couplings "M" are not explicitly indicated in all figures, other transmission-line filters can be magnetically coupled between or among different transmission-line base units.

FIG. 5-2 is a circuit diagram 500-2 illustrating the transmission-line filter 302 of FIG. 5-1 with an example schematic overlay. To facilitate understanding, an example correspondence between some the schematic components of FIGS. 3-1 and 3-2 and the circuit components of FIG. 5-1 is provided in FIG. 5-2. For context, the proximal portion 316 and the distal portion 318 are also indicated. The signal pathway 308 extends between the input port 304 and the output port 306. Although a single signal pathway 308 is explicitly depicted as being disposed between the two ports in FIG. 5-2, a transmission-line filter 302 may include multiple signal pathways. At least a portion of each of the multiple transmission lines and any one or more of the capacitors C1, C2, and C3 (as well as the capacitor C4) can be included as part of the at least one signal pathway 308.

The first transmission-line base unit 310-1 includes the capacitor C1, the transmission line TL1, and the inductor L11. The second transmission-line base unit 310-2 includes the capacitor C2, the transmission line TL2, and the inductor L22. The third transmission-line base unit 310-3 includes the capacitor C3 and the transmission line TL3. Although not explicitly indicated in FIG. 5-2 for visual clarity, the signal pathway interface 312-1 (of FIG. 3-1) can include at least the capacitor C1 and the electrical connection to the input port 304. Similarly, the signal pathway interface 312-2 can include at least the capacitor C2 and the electrical connection to the output port 306. For the third transmission-line base unit 310-3, the signal pathway interface 312-3 can include at least the capacitor C3 as well as the magnetic couplings M1 (of FIG. 5-1).

The multi-resonant circuits 314-1 and 314-2 share the capacitor Cg and have in common the inductor L11 and the inductor L22. Thus, the capacitor 362-1 corresponds to the capacitor Cg. Similarly, the inductor 364-1 corresponds to the inductor L11, and the inductor 364-2 corresponds to the inductor L22. However, other correspondences can be drawn between the schematic diagrams and the circuit diagrams. Further, a transmission-line filter 302 can be implemented using different components or circuitry.

FIG. 5-3 is a perspective rendering 500-3 that illustrates an example three-dimensional realization 540 of the transmission-line filter 302 of FIG. 5-1. In the three-dimensional realization 540, the ground plane 320 is fabricated on one side of the substrate 366 (e.g., the lower side as depicted), and the transmission lines and capacitors are fabricated on an opposite side (the upper side as depicted here). Some components on the upper side of the substrate 366 are electrically coupled to the ground plane 320 on the lower side of the substrate 366 using at least one vertical interconnect access (via). Other components, such as the input port 304 and the output port 306 are electrically coupled through the substrate 366 to another layer to receive an incoming signal or provide an outgoing filtered signal, respectively, using at least one via. Generally, the transmission-line filter of the three-dimensional realization 540 includes multiple vertical interconnect accesses (vias) that each individually couple at least one end of each of the multiple transmission lines (TL1, TL2, or TL3) to the ground 320. Here, eight vias are depicted, with eight pertaining to the transmission lines and one apiece pertaining to the input port 304 and the output port 306. For visual clarity, four of the vias are indicated with a reference number "542": a via 542-1, a via 542-2, a via 542-3, and a via 542-4.

Also shown in the three-dimensional realization 540 are the input port 304, the output port 306, and the capacitor C4. Here, the capacitor C4 is implemented as a series of four capacitors. The via 542-4 is depicted coupling the output port 306 through the substrate 366 to another layer for forwarding the filtered signal. The third transmission-line base unit includes the capacitor C3 and the transmission line TL3. Both ends of the third transmission-line base unit are coupled to the ground plane 320 using a via, including the via 542-3 at the distal end of the transmission line TL3.

The first transmission-line base unit includes the capacitor C1, the transmission line TL1, and the inductor L11. In this example, instead of a separate architected inductor, the inductor L11 is implemented using the intrinsic inductive reactance of the via 542-1. The second transmission-line base unit includes the capacitor C2, the transmission line TL2, and the inductor L22. The inductor L22 is also implemented using an intrinsic inductance, which is the inductive reactance of the via 542-2 in this case. The capacitor Cg is fabricated on the upper side of the substrate 366 and is coupled between distal ends of the transmission lines TL1 and TL2 proximate to the via 542-1 and the via 542-2, respectively. This coupling of the capacitor Cg to the vias 542-1 and 542-2 causes the intrinsic inductance of the vias to appreciably impact the frequency response of the transmission-line filter. Thus, the combination of the capacitance and the inductance can provide a resonance frequency to generate an additional passband resonance, which creates a corresponding additional pole. An example frequency performance, including the presence of multiple poles, is described below with reference to FIG. 5-4.

As depicted in FIG. 5-3, the three-dimensional realization 540 includes three transmission-line base units that are disposed in a chained series between the input port 304 and the output port 306. Further, the three transmission-line base units are arranged substantially in parallel with respect to each other. Nevertheless, as shown, the first and second transmission lines TL1 and TL2 each include a detour path with at least one turn. In the illustrated example, three turns are implemented in a manner that results in a "question mark" shape for each transmission line TL1 and TL2. By employing the detour paths, a smaller area on the upper side of the substrate 366 is occupied by the example three-dimensional realization 540 for the transmission-line filter 302. However, the first and second transmission lines TL1 and TL2 can alternatively be implemented with one respective straight path apiece or with different shapes. Regardless, the three transmission-line base units can be disposed as shown substantially in parallel with respect to each other between the input port 304 and the output port 306.

FIG. 5-4 is a graph 500-4 illustrating an example performance of the transmission-line filter 302 of FIG. 5-1. The graph 500-4 has an abscissa/horizontal axis of frequency denoted in gigahertz (GHz) and a ordinate/vertical axis of signal strength denoted in decibels (dB). The decibels extend from −50 to 0 dB, and the frequencies extend from 1 to 10 GHz. Two scattering parameters are depicted. An S(1,1) parameter performance profile (S11) and an S(2,1) parameter performance profile (S21) for the transmission-line filter 302 of FIG. 5-1 are graphed. The S(1,1) parameter corresponds to an input reflection coefficient, and the S(2,1) parameter corresponds to an input-to-output transmission coefficient.

The S(1,1) parameter characteristic has four resonant frequencies as indicated by the four poles, which include poles 404-1, 404-2, 404-3, and 404-4. Thus, a quantity of poles (which is 4 here), which corresponds to a quantity of multiple resonant frequencies, is greater than (e.g., exceeds) a quantity of transmission-line base units (which is 3) in this example. These four resonant frequencies span an approximately 2 to 2.3 GHz range between about 4.7 and 7 GHz. The pole 404-1 is produced by the transmission line TL3 and the capacitor C3. The poles 404-2 and 404-3 are produced by the transmission line TL2, the capacitor C2, the capacitor Cg, the inductor L1, and the inductor L2. Generally, a first quantity of transmission-line base units can be less than a second quantity of multiple resonant frequencies, which can correspond to an equal, second quantity of poles in an S(1,1) parameter performance characterization.

Thus, a multi-resonant transmission-line base unit creates at least one additional resonant frequency that is manifested as at least one additional pole in the S(1,1) parameter performance profile. The additional pole spreads the S(1,1)

performance parameter characteristics across a wider frequency range. As a result, the passband of the S(2,1) parameter is likewise spread across a wider frequency range. As shown, the passband of the S21 graph extends across over 2 GHz, from approximately 4.7 to 7.2 GHz. Further, the left skirt is almost vertical as the attenuation increases from approximately −2 to −37 dB over just two to four hundred MHz. The right skirt is also fairly sharp and increases the attenuation by more than 20 dB in less than one GHz.

Figure 6:
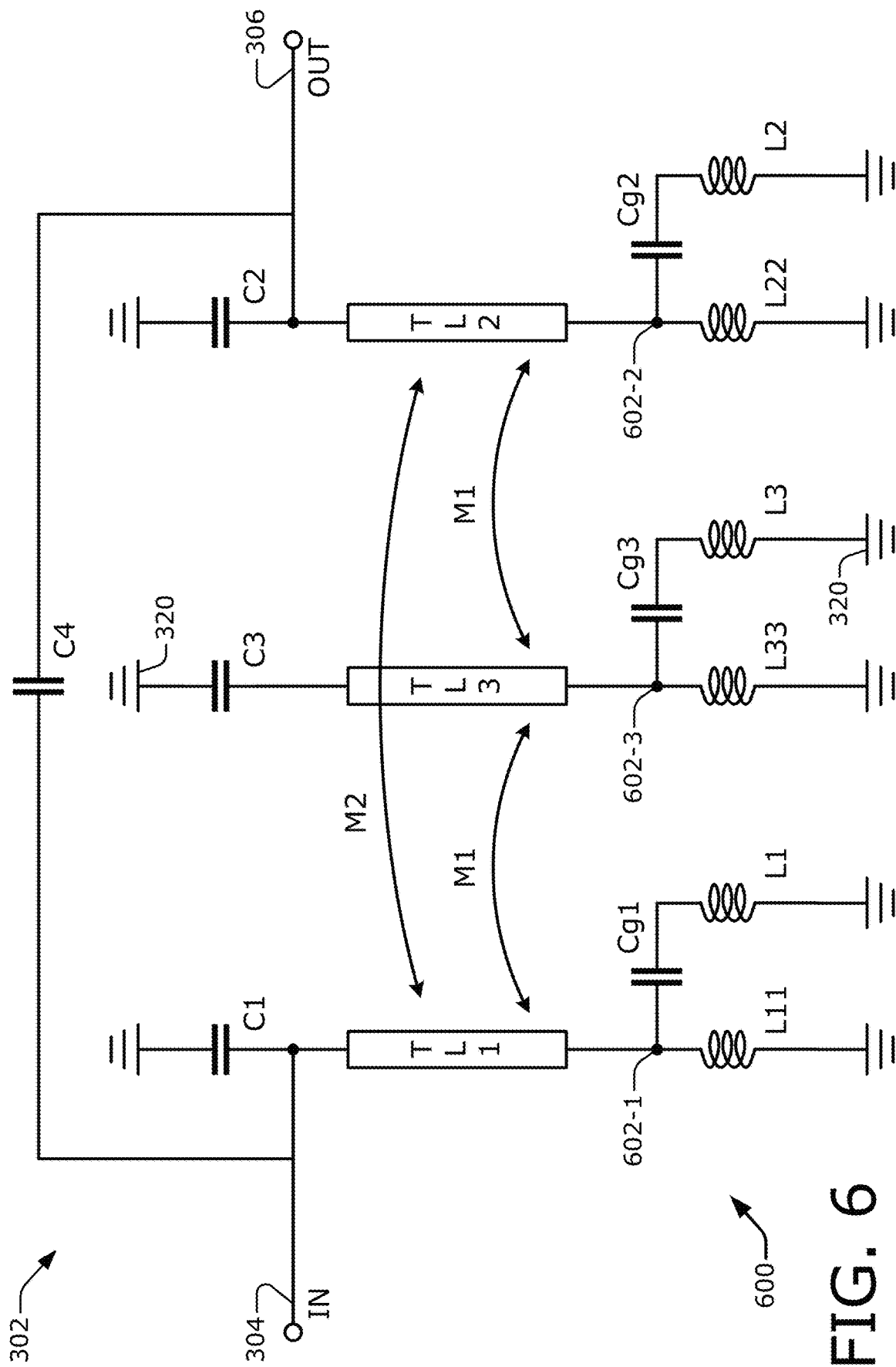
FIG. 6 is a circuit diagram illustrating an example transmission-line filter with enhanced frequency response using a separate capacitor for each transmission-line base unit.

FIG. 6 is a circuit diagram 600 illustrating an example transmission-line filter 302 with enhanced frequency response using a separate capacitor for each transmission-line base unit. The example transmission-line filter 302 of FIG. 6 has some similarities with respect to the example transmission-line filter 302 of FIG. 5-1. Accordingly, for brevity, identical an analogous components and aspects are not repeated here. However, some differences are set forth below. For example, no capacitor is shared between two transmission-line base units as part of a multi-resonant circuit in the transmission-line filter 302 of FIG. 6. Instead, each respective transmission-line base unit includes an individual respective multi-resonant circuit. Each transmission-line base unit can therefore generate two resonate frequencies that are manifested as two poles in the S(1,1) parameter performance.

Thus, in some implementations, each transmission-line base unit includes a respective multi-resonant circuit. As shown, each multi-resonant circuit includes a first inductor that is coupled in parallel with a series-connection of a capacitor and a second inductor. In the first transmission-line base unit on the left, an inductor L11 is coupled between a node 602-1 and the ground 320, and a capacitor Cg1 is coupled in series with an inductor L1 between the node 602-1 and the ground 320. In the second transmission-line base unit on the right, an inductor L22 is coupled between a node 602-2 and the ground 320, and a capacitor Cg2 is coupled in series with an inductor L2 between the node 602-2 and the ground 320. In the third transmission-line base unit in the interior or middle, an inductor L33 is coupled between a node 602-3 and the ground 320, and a capacitor Cg3 is coupled in series with an inductor L3 between the node 602-3 and the ground 320.

Figures 1, 7:
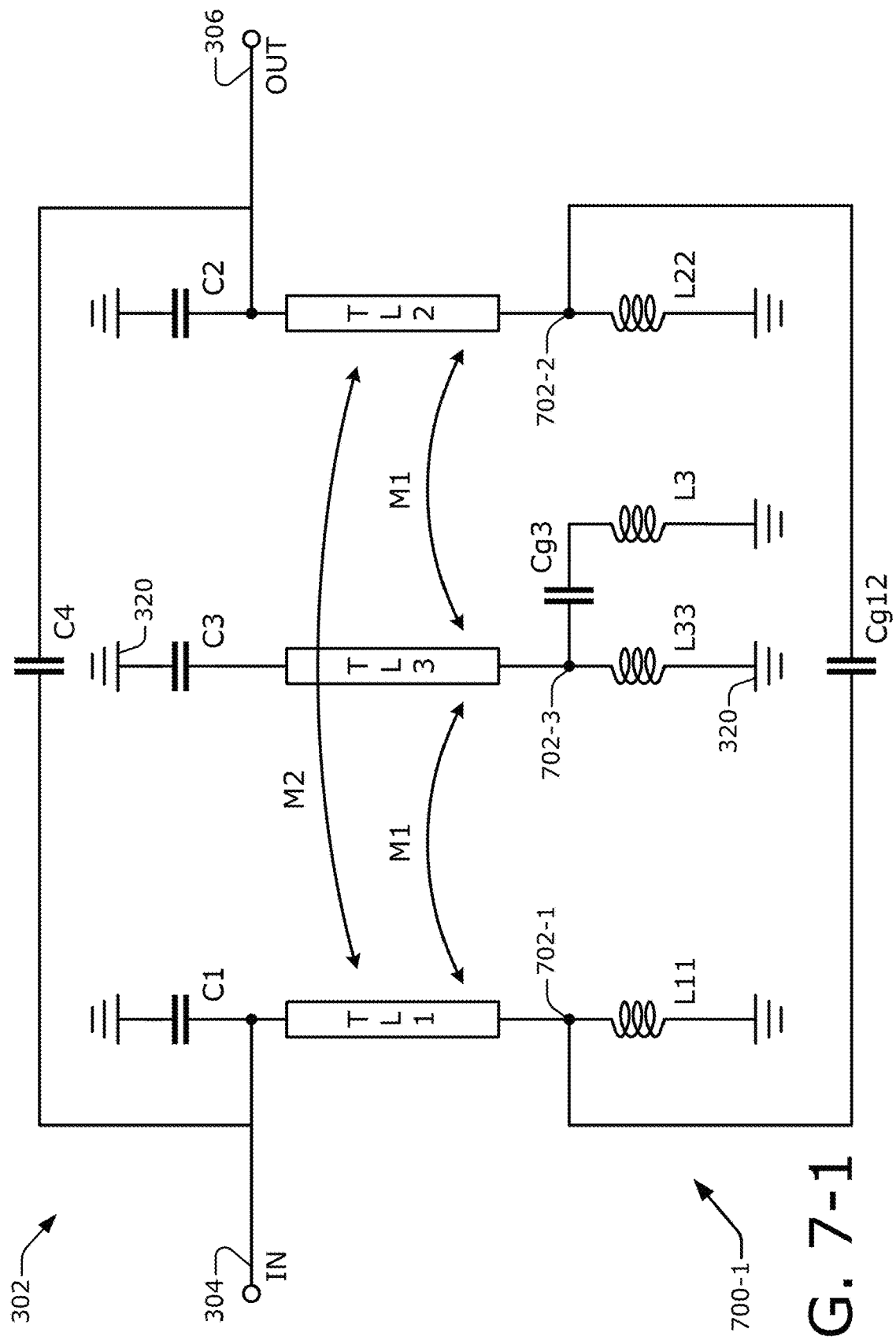
Figures 2, 7:
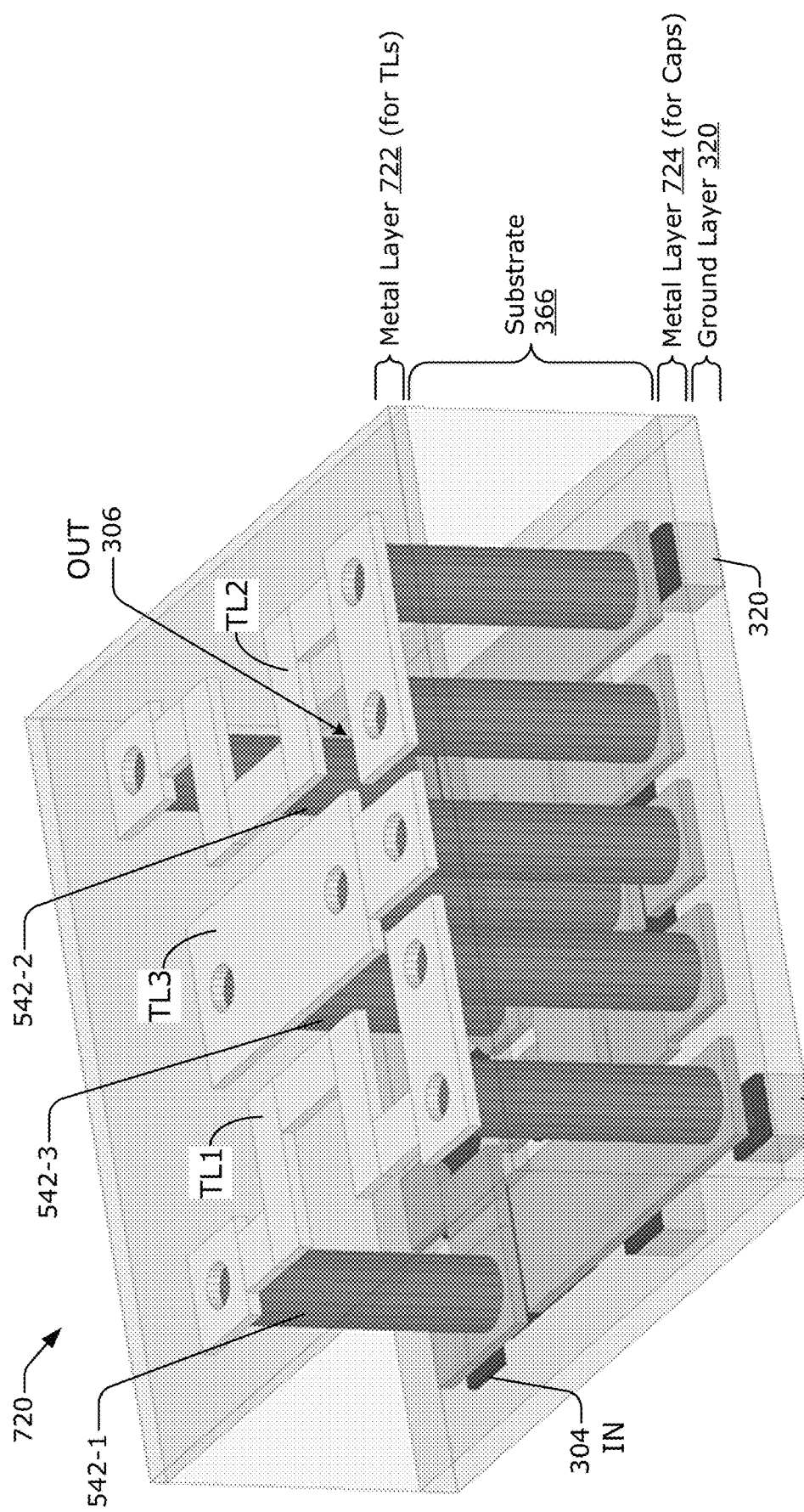
Figures 3, 7:
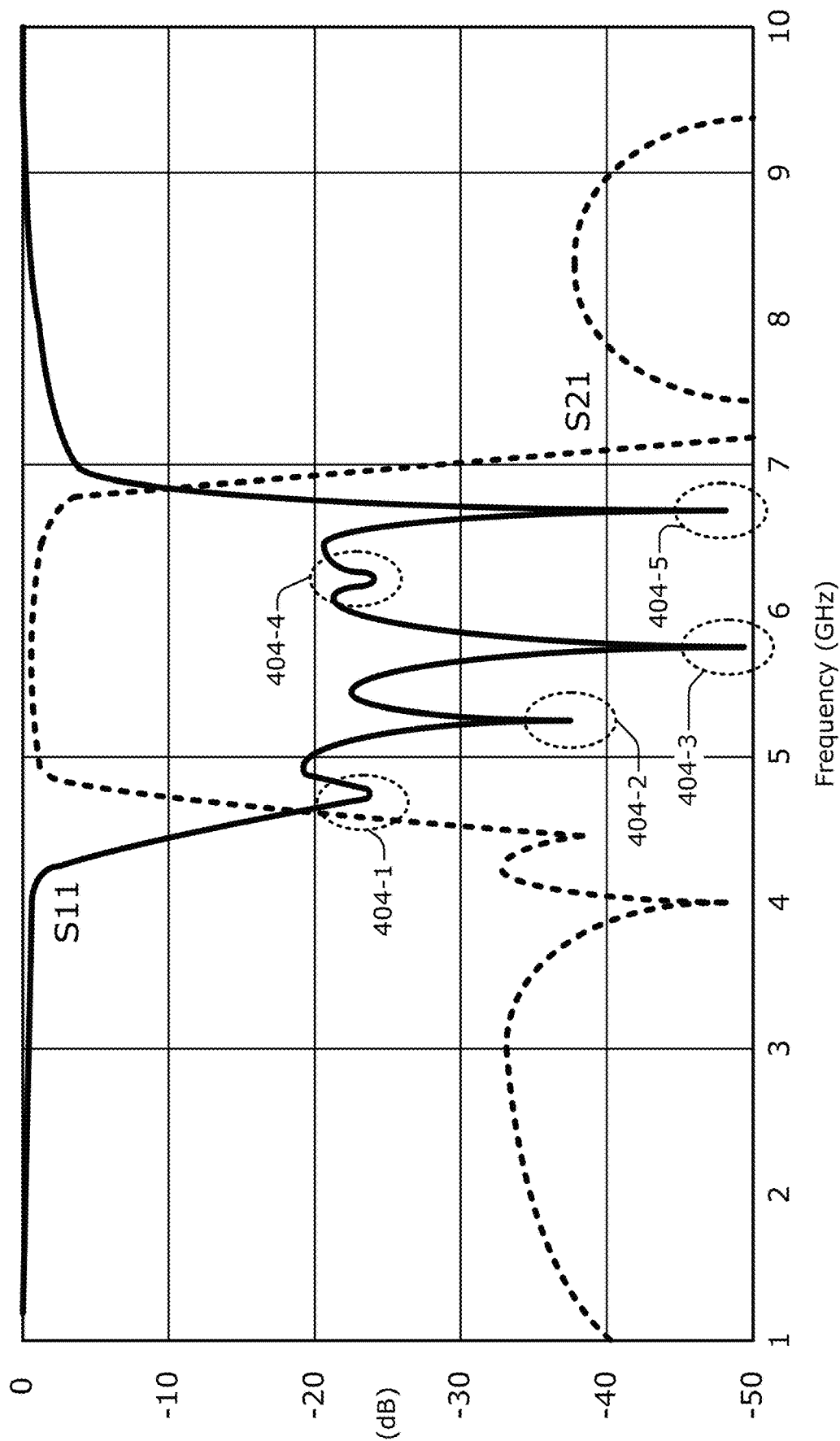

FIG. 7-1 is a circuit diagram 700-1 illustrating an example transmission-line filter 302 with enhanced frequency response. This example uses both a shared capacitor Cg12 that bridges two transmission-line base units and a separate capacitor Cg3 for another transmission-line base unit. Thus, the example transmission-line filter 302 of FIG. 7-1 is similar to a combination of the example transmission-line filter 302 of FIG. 5-1 (which has a shared capacitor in common across two multi-resonant circuits) and the example transmission-line filter 302 of FIG. 6 (which has individual multi-resonant circuits for each transmission-line base unit). Accordingly, for brevity, identical an analogous components and aspects are not repeated here.

In the transmission-line filter 302 of FIG. 7-1, the capacitor Cg12 is coupled between the first transmission-line base unit on the left at a node 702-1 and the second transmission-line base unit on the right at a node 702-2. An inductor L11 is coupled between the node 702-1 and the ground 320, and an inductor L22 is coupled between the node 702-2 and the ground 320. A parallel resonant circuit is therefore established with the capacitor Cg12, the inductor L11, and the inductor L22, e.g., between the node 702-1 and the ground 320 and between the node 702-2 and the ground 320. In the third transmission-line base unit in the middle, an inductor L33 is coupled between a node 702-3 and the ground 320.

A capacitor Cg3 is coupled in series with an inductor L3 between the node 702-3 and the ground 320. A parallel resonant circuit is therefore established with the capacitor Cg3, the inductor L33, and the inductor L3 between the node 702-3 and the ground 320. An example frequency performance, including the presence of multiple poles, is described below with reference to FIG. 7-3.

FIG. 7-2 is a perspective rendering 700-2 that illustrates an example three-dimensional realization 720 of the transmission-line filter 302 of FIG. 7-1. In the three-dimensional realization 720, the transmission lines are fabricated on one side of the substrate 366 (e.g., the upper side as depicted), and the capacitors and ground plane are fabricated on an opposite side (the lower side as depicted). The transmission lines on the upper side of the substrate 366 are electrically coupled to a capacitor or the ground layer 320 on the lower side of the substrate 366 using at least one via 542. As indicated on the right, a "top" layer comprises a metal layer 722 for the transmission lines (TLs), and the substrate 366 is located below the metal layer 722. A metal layer 724 for the capacitors (Caps) is below the substrate 366, and the metal layer 724 is above the ground layer 320.

The input port 304 and the output port 306 are indicated (with a full view of the output port 306 obscured by other items depicted in the foreground). The first transmission line TL1, the second transmission line TL2, and the third transmission line TL3 are depicted as being disposed in a chained series between the input port 304 and the output port 306. A via 542-1 corresponds to the inductor L11 of the first transmission-line base unit on the left of FIG. 7-1. A via 542-2 corresponds to the inductor L22 of the second transmission-line base unit on the right of FIG. 7-1. A via 542-3 corresponds to the inductor L33 of the third transmission-line base unit in the interior region of the transmission-line filter 302 of FIG. 7-1. In the illustrated three-dimensional realization 720, the substrate 366 is formed from glass and is approximately 300 micrometers (um) thick. However, the substrate 366 can be fabricated from any material, including a glass material, a PCB material, a semiconductor material, and so forth and of various thicknesses.

FIG. 7-3 is a graph 700-3 illustrating an example performance of the transmission-line filter 302 of FIG. 7-1. The graph 700-3 is analogous to the graph 500-4 of FIG. 5-4 in terms of axes and including an S(1,1) parameter performance profile (S11) and an S(2,1) parameter performance profile (S21). However, the shapes of these two profiles differ as compared to those of FIG. 5-4. Further, the S(1,1) parameter performance profile includes five poles 404-1, 404-2, 404-3, 404-4, and 404-5 that manifest the five resonant frequencies generated by the transmission-line filter 302 of FIG. 7-1. One of the five poles arises from the baseline properties of the transmission-line filter 302. Two of the five poles arise from a combination of the transmission line TL2, the capacitor C2, the capacitor Cg12, the inductor L22, and the inductor L11. The other two of the five poles arise from a combination of the transmission line TL3, the capacitor C3, the capacitor Cg3, the inductor L33, and the inductor L3.

Figure 8:
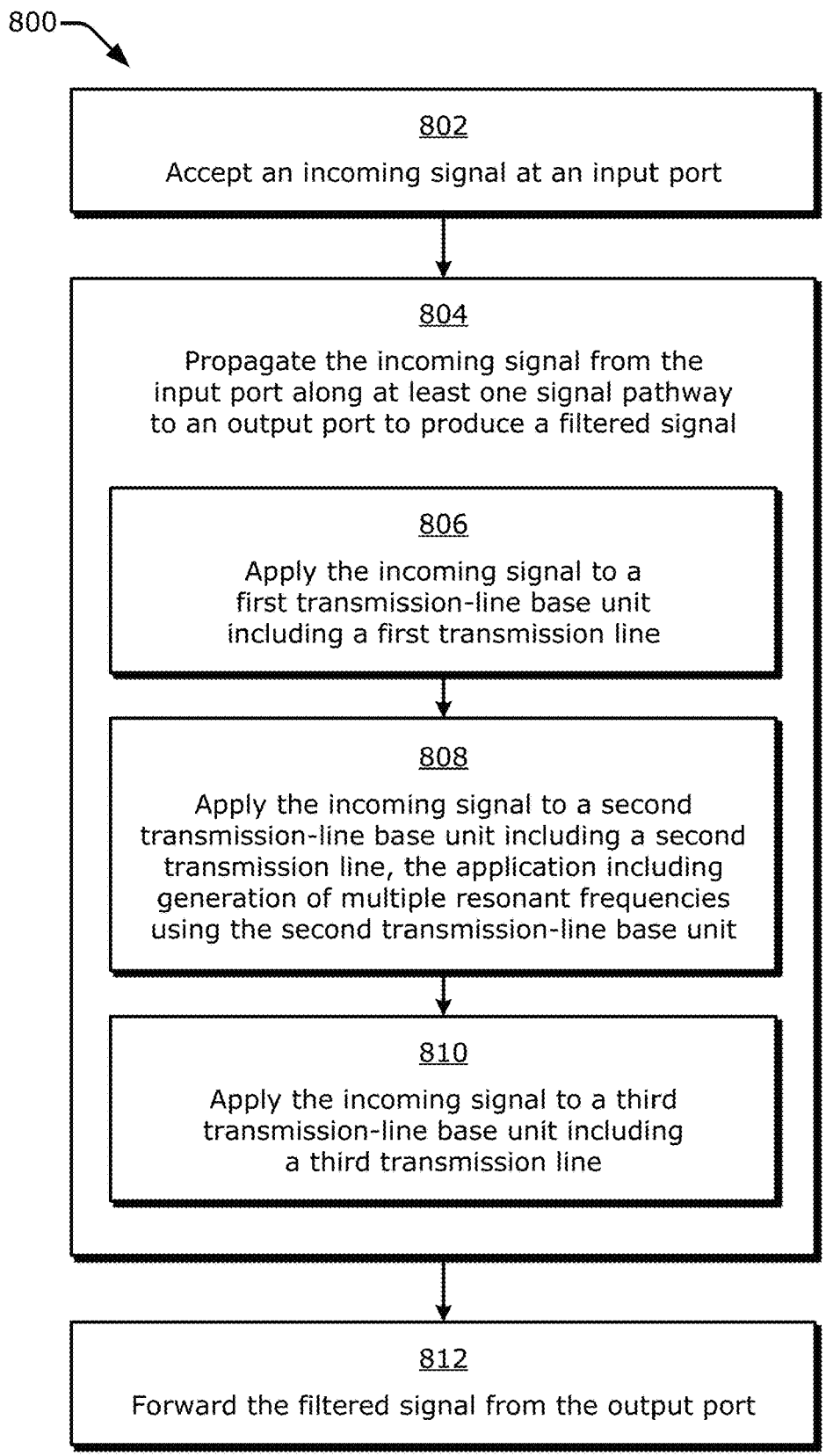
FIG. 8 is a flow diagram illustrating an example process for operating a transmission-line filter with enhanced frequency response.

FIG. 8 is a flow diagram illustrating an example process 800 for operating a transmission-line filter with enhanced frequency response. The process 800 is described in the form of a set of blocks 802-812 that specify operations that can be performed. However, operations are not necessarily limited to the order or nesting shown in FIG. 8 or described herein, for the operations may be implemented in alternative orders or in fully or partially overlapping manners. Operations represented by the illustrated blocks of the process 800 may be performed by a transmission-line filter 302 (e.g., of FIG. 3-1, 3-2, 5-1, 5-2, 6, or 7-1). More specifically, the operations of the process 800 may be performed by a first transmission-line base unit 310-1, a second transmission-line base unit 310-2, and a third transmission-line base unit 310-3.

At block 802, an incoming signal is accepted at an input port. For example, a transmission-line filter 302 can accept an incoming signal 322 at an input port 304. The incoming signal 322 may have one or more relatively strong amplitudes in a frequency range that is outside of a frequency band of interest. Thus, this frequency range can be attenuated to obtain the desired frequency band.

At block 804, the incoming signal is propagated from the input port along at least one signal pathway to an output port to produce a filtered signal. For example, the transmission-line filter 302 can propagate the incoming signal 322 from the input port 304 along at least one signal pathway 308 of potentially multiple signal pathways of the transmission-line filter 302 to an output port 306 to produce a filtered signal. The at least one signal pathway 308 may include an electrical component, a magnetic component, or multiple ones of such components to enable the signal to travel from the input port 304 to the output port 306 during the filtering operation.

The propagation that is performed as part of the block 804 can be implemented by causing the incoming signal 322 to be applied to multiple transmission-line base units of the transmission-line filter 302, as indicated by nested blocks 806-810. At block 806, the incoming signal is applied to a first transmission-line base unit including a first transmission line. For example, circuitry can apply the incoming signal 322 to a first transmission-line base unit 310-1 including a first transmission line 360-1. To do so, the first transmission-line base unit 310-1 may be at least electrically coupled to the input port 304. The components of the first transmission-line base unit 310-1 may have an impedance or a reactance that affect the propagating signal, such as by rejecting a given frequency or permitting a particular frequency to pass. In some implementations, the application of the incoming signal to the first transmission-line base unit can include generating two or more resonant frequencies using the first transmission-line base unit.

At block 808, the incoming signal is applied to a second transmission-line base unit including a second transmission line. The applying includes generating multiple resonant frequencies using the second transmission-line base unit. For example, circuitry can apply the incoming signal 322 to a second transmission-line base unit 310-2 including a second transmission line 360-2. To do so, the second transmission-line base unit 310-2 may be at least electrically coupled to the output port 306. The application of the signal being filtered can include generating multiple resonant frequencies using the second transmission-line base unit 310-2. For example, a multi-resonant circuit 314 that is part of the second transmission-line base unit 310-2 may generate at least two resonate frequencies that manifest as at least two poles in an S(1,1) parameter performance profile. The multi-resonant circuit 314 may include a parallel resonant structure including at least one capacitive element and at least one inductive element that at least partially establish a parallel resonance between the second transmission line 360-2 and a ground 320 for the multiple resonant frequencies.

At block 810, the incoming signal is applied to a third transmission-line base unit including a third transmission line. For example, circuitry can apply the incoming signal 322 to a third transmission-line base unit 310-3 including a third transmission line 360-3. For example, the third transmission-line base unit 310-3 may be at least magnetically coupled to the input port 304 or the output port 306 to further filter the signal. Additionally or alternatively, application of the incoming signal 322 can be enhanced with a multi-resonant circuit 314 that is coupled to the third transmission line 360-3 of the third transmission-line base unit 310-3. Thus, in some implementations, the propagation of the incoming signal from the input port to the output port along the signal pathway to produce the filter signal can include creating at least four resonant frequencies, including the multiple resonant frequencies, using the first transmission-line base unit, the second transmission-line base unit, and the third transmission-line base unit.

At block 812, the filtered signal is forwarded from the output port. For example, the transmission-line filter 302 can forward the filtered signal from the output port 306 as an outgoing filtered signal 324. Thus, the transmission-line filter 302 may forward a signal that significantly attenuates signal power in an undesired frequency range but does not appreciably reduce signal power in the desired frequency band. Further, the desired frequency band can be wider due to the multiple resonant frequencies generated by a single transmission-line base unit 310 having a multi-resonant circuit 314.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus for enhancing a frequency response of a filtering operation, the apparatus comprising:
    a transmission-line filter including:
        an input port;
        an output port; and
        multiple transmission-line base units disposed between the input port and the output port,
            each of the multiple transmission-line base units including a respective transmission line,
            wherein the multiple transmission-line base units comprise:
                a first transmission-line base unit including a first multi-resonant circuit including a parallel resonant circuit coupled between a ground and a distal end of the respective transmission line of the first transmission-line base unit; and
                a second transmission-line base unit including a second multi-resonant circuit, wherein the first multi-resonant circuit and the second multi-resonant circuit share a common capacitor that bridges the first transmission-line base unit and the second transmission-line base unit.

2. The apparatus of claim 1, wherein:
the multiple transmission-line base units comprise a first quantity;
the transmission-line filter is configured to generate multiple resonant frequencies that comprise a second quantity based partially on the first multi-resonant circuit; and
the second quantity is greater than the first quantity.

3. The apparatus of claim 2, wherein the transmission-line filter is configured to manifest the second quantity of multiple resonant frequencies by creating a second quantity of poles in an S(1,1) parameter performance characterization.

4. The apparatus of claim 1, wherein the respective transmission line of at least one transmission-line base unit of the multiple transmission-line base units comprises:
a conductive strip; and
a ground strip positioned in a parallel arrangement with respect to the conductive strip.

5. The apparatus of claim 4, wherein:
the at least one transmission-line base unit is configured to resonate at an operating frequency; and
a length of the conductive strip of the respective transmission line of the at least one transmission-line base unit is dimensioned based on a wavelength of the operating frequency.

6. The apparatus of claim 4, further comprising:
a substrate comprising at least one of a glass material, a printed circuit board (PCB) material, or a semiconductor material; and
a ground plane on a side of the substrate, wherein:
at least a portion of each of the multiple transmission-line base units, including the conductive strip, is disposed on another side of the substrate, the another side of the substrate opposite the side of the substrate; and
the ground plane includes the ground strip.

7. The apparatus of claim 1, wherein the first multi-resonant circuit of the first transmission-line base unit is configured to resonate with respect to at least two frequencies.

8. The apparatus of claim 7, wherein the first transmission-line base unit is configured to create at least two poles in an S(1,1) parameter performance associated with the transmission-line filter.

9. The apparatus of claim 1, wherein:
the transmission-line filter comprises multiple vertical interconnect accesses (vias) that each individually couple at least one end of each respective transmission line to the ground;
a via of the multiple vias couples an end of the respective transmission line of the first transmission-line base unit to the ground;
the via includes an intrinsic inductance; and
the intrinsic inductance of the via forms at least a portion of an inductance of the first multi-resonant circuit.

10. The apparatus of claim 1, wherein the parallel resonant circuit comprises:
an inductor coupled to the ground; and
the common capacitor coupled to the respective transmission line of the first transmission-line base unit and the inductor.

11. The apparatus of claim 10, wherein the inductor comprises a vertical interconnect access (via).

12. The apparatus of claim 1, further comprising:
at least one signal pathway disposed between the input port and the output port, wherein:

the multiple transmission-line base units are disposed in a chained series between the input port and the output port;
each respective transmission line comprises a respective conductive strip; and
each respective conductive strip is arranged substantially in parallel with respect to other respective conductive strips and substantially perpendicular to the at least one signal pathway.

13. The apparatus of claim 1, further comprising:
at least one signal pathway disposed between the input port and the output port, wherein:
each of the multiple transmission-line base units comprises a proximal portion and a distal portion, the proximal portion of each transmission-line base unit disposed along the at least one signal pathway, each respective transmission-line base unit extending away from the at least one signal pathway to the respective distal portion thereof; and
the common capacitor coupled to the distal portion of the first transmission-line base unit.

14. The apparatus of claim 13, wherein:
the common capacitor is coupled between the distal portion of the first transmission-line base unit and the distal portion of the second transmission-line base unit.

15. An apparatus for enhancing a frequency response of a filtering operation, the apparatus comprising:
a transmission-line filter including:
an input port;
an output port;
multiple transmission lines disposed between the input port and the output port, the multiple transmission lines including:
a first transmission line electrically coupled between the input port and a ground;
a second transmission line electrically coupled between the output port and the ground, the second transmission line having a proximal end and a distal end; and
a third transmission line disposed between the first transmission line and the second transmission line; and
a capacitor electrically coupled to the distal end of the second transmission line, wherein the proximal end of the second transmission line is closer to the output port than is the distal end of the second transmission line;
the transmission-line filter includes an inductor coupled between the distal end of the second transmission line and the ground; and
the inductor and the capacitor are coupled together in parallel between the distal end of the second transmission line and the ground,
wherein the first transmission line has another proximal end and another distal end; and
the capacitor is electrically coupled between the distal end of the second transmission line and the another distal end of the first transmission line.

16. A method for operating a transmission-line filter with enhanced frequency response, the method comprising:
accepting an incoming signal at an input port;
propagating the incoming signal from the input port along at least one signal pathway to an output port to produce a filtered signal, the propagating including:
applying the incoming signal to a first transmission-line base unit including a first transmission line;

applying the incoming signal to a second transmission-line base unit including a second transmission line, the applying including generating multiple resonant frequencies using the second transmission-line base unit, wherein the first transmission-line base unit and the second transmission-line base unit share a common capacitor that bridges the first transmission-line base unit and the second transmission-line base unit, the generating including establishing a parallel resonance between the second transmission line and a ground for the multiple resonant frequencies using at least one inductor and the common capacitor that are coupled to a distal end of the second transmission line; and applying the incoming signal to a third transmission-line base unit including a third transmission line; and forwarding the filtered signal from the output port.

17. The method of claim 16, wherein the propagating comprises resonating at four or more resonant frequencies, which include the multiple resonant frequencies, using the first transmission-line base unit, the second transmission-line base unit, and the third transmission-line base unit.

18. The method of claim 16, wherein the applying the incoming signal to the first transmission-line base unit comprises generating two or more resonant frequencies using the first transmission-line base unit.

19. An apparatus for enhancing a frequency response of a filtering operation, the apparatus comprising:
a transmission-line filter including:
a plurality of electromagnetically coupled transmission lines coupled between an input of the transmission-line filter and an output of the transmission-line filter, the plurality of electromagnetically coupled transmission lines including:
a first transmission line;
a second transmission line; and
a third transmission line;
a first inductor coupled between the first transmission line and ground, wherein a first end of the first transmission line is coupled to at least one of the input of the transmission-line filter or the output of the transmission-line filter, wherein the first inductor is coupled between a second end of the first transmission line and ground;
a first capacitor coupled in parallel with the first inductor and coupled in series to a second inductor; and
a second capacitor coupled between ground and the first end of the first transmission line.

20. The apparatus of claim 19, wherein the first transmission line is coupled to the input of the transmission-line filter and the third transmission line is coupled to the output of the transmission-line filter.

21. The apparatus of claim 19, wherein the first capacitor is coupled to the second transmission line.

22. The apparatus of claim 19, wherein:
the transmission-line filter comprises a vertical interconnect access (via) that couples an end of the first transmission line to the ground;
the via includes an intrinsic inductance; and
the intrinsic inductance of the via forms at least a portion of an inductance of the first inductor.

23. The apparatus of claim 19, further comprising a third capacitor coupled between the input of the transmission-line filter and the output of the transmission-line filter.

* * * * *